(12) United States Patent
Hsieh et al.

(10) Patent No.: US 10,629,452 B2
(45) Date of Patent: Apr. 21, 2020

(54) MANUFACTURING METHOD OF A CHIP PACKAGE STRUCTURE

(71) Applicants: NIKO SEMICONDUCTOR CO., LTD., New Taipei (TW); SUPER GROUP SEMICONDUCTOR CO., LTD., Hsinchu County (TW)

(72) Inventors: Chih-Cheng Hsieh, Taoyuan (TW); Hsiu-Wen Hsu, Hsinchu County (TW)

(73) Assignees: NIKO SEMICONDUCTOR CO., LTD., New Taipei (TW); SUPER GROUP SEMICONDUCTOR CO., LTD., Hsinchu County (TW)

( * ) Notice: Subject to any disclaimer, the term of this patent is extended or adjusted under 35 U.S.C. 154(b) by 65 days.

(21) Appl. No.: 15/911,290

(22) Filed: Mar. 5, 2018

(65) Prior Publication Data

US 2018/0190507 A1 Jul. 5, 2018

Related U.S. Application Data

(62) Division of application No. 15/135,182, filed on Apr. 21, 2016, now Pat. No. 9,947,551.

(30) Foreign Application Priority Data

May 15, 2015 (TW) .............................. 104115547 A

(51) Int. Cl.
*H01L 21/48* (2006.01)
*H01L 25/07* (2006.01)
(Continued)

(52) U.S. Cl.
CPC ...... *H01L 21/4825* (2013.01); *H01L 21/4828* (2013.01); *H01L 21/4842* (2013.01);
(Continued)

(58) Field of Classification Search
CPC ............. H01L 21/4825; H01L 21/4842; H01L 21/4828; H01L 23/49513; H01L 23/492;
(Continued)

(56) References Cited

U.S. PATENT DOCUMENTS 7,863,730 B2 * 1/2011 Shim, II ................ H01L 21/565
257/706
8,525,344 B2 * 9/2013 Pagaila ................ H01L 21/561
257/774
(Continued)

*Primary Examiner* — Hoa B Trinh
(74) *Attorney, Agent, or Firm* — Li & Cai Intellectual Property (USA) Office

(57) ABSTRACT

A manufacturing method of a chip package structure is provided. Firstly, a conductive frame including a bottom plate and a plurality of partition plates is provided. The bottom plate has a supporting surface and a bottom surface opposite thereto, and the partition plates protrude from the supporting surface to define a plurality of the accommodating regions. Subsequently, a plurality of chips is provided, and each of the chips is correspondingly accommodated in each of the accommodating regions with a back surface facing to the supporting surface. Thereafter, the conductive frame is cut to form a plurality of separated chip package structures.

9 Claims, 21 Drawing Sheets

(51) Int. Cl.
*H01L 23/544* (2006.01)
*H01L 23/492* (2006.01)
*H01L 23/495* (2006.01)

(52) U.S. Cl.
CPC ...... *H01L 23/492* (2013.01); *H01L 23/49513* (2013.01); *H01L 23/49562* (2013.01); *H01L 23/544* (2013.01); *H01L 25/072* (2013.01); *H01L 2223/54426* (2013.01); *H01L 2223/54486* (2013.01); *H01L 2224/73253* (2013.01); *H01L 2224/97* (2013.01)

(58) Field of Classification Search
CPC . H01L 23/49562; H01L 23/544; H01L 24/46; H01L 25/0652
See application file for complete search history.

(56) References Cited

U.S. PATENT DOCUMENTS

| | | | |
|---|---|---|---|
| 2015/0001699 A1* | 1/2015 | Funatsu | H01L 24/34 257/676 |
| 2016/0057833 A1* | 2/2016 | Oh | H05B 33/22 362/235 |
| 2016/0126228 A1* | 5/2016 | Hsieh | H01L 24/19 257/676 |
| 2016/0211240 A1* | 7/2016 | Hsieh | H01L 23/4827 |
| 2016/0254214 A1* | 9/2016 | Makino | H01L 24/97 257/676 |

* cited by examiner

MANUFACTURING METHOD OF A CHIP PACKAGE STRUCTURE

CROSS REFERENCE TO RELATED APPLICATIONS

This application is a divisional application of Ser. No. 15/135,182 filed on Apr. 21, 2016, and entitled "CHIP PACKAGE STRUCTURE AND MANUFACTURING METHOD THEREOF", now pending, the entire disclosures of which are incorporated herein by reference.

BACKGROUND OF THE INVENTION

1. Field of the Invention

The instant disclosure relates to a semiconductor package process, in particular, to a chip package structure and manufacturing method thereof for decreasing the use of encapsulation molding.

2. Description of Related Art

As the development of portable or wearable electronic devices increases, multi-function products having small size, high efficiency, high operating speed, and high quality need to be developed to meet the recent trends. To minimize shape and size of the consumer electronic devices, wafer level chip scale packaging processes are usually used to encapsulate the chip. In the chip scale package device, the solder bumps replace the use of bonding wires to reduce the resistance of the circuit and the parasitic inductance and improve the operating frequency of the device. Furthermore, since the size of the package product is equal to or slightly larger than that of the chip, the power density also can be optimized.

Furthermore, in a conventional packaging process, the molding compound is usually used to encapsulate the chip. The molding compound provides structural support for the chip and prevents damage to the chip during the transportation or the fabrication process and also entry of moisture. However, the molding compound used to protect the chip may cause environmental pollution.

SUMMARY OF THE INVENTION

The object of the instant disclosure is to provide a chip package structure and manufacturing method thereof. In the chip package structure, a conductive frame is used to package the chip and provide structural support and protection to reduce the use of the molding compound. Furthermore, in the manufacturing method of the chip package structure provided in the instant disclosure, the chip package structure can be formed to be implemented in different circuit by adjusting the cutting position according to different application requirements of different design circuits.

In order to achieve the aforementioned objects, according to an embodiment of the instant disclosure, a manufacturing method of a chip package structure is provided. Firstly, a conductive frame having a bottom plate and a plurality of partition plates arranged on the bottom plate is provided, in which the bottom plate has a supporting surface and a bottom surface opposite to the supporting surface, and the partition plates are disposed on the supporting surface to define a plurality of accommodating regions. Subsequently, a plurality of chips is fixed on the corresponding accommodating region, in which a back surface of each chip is connected to the supporting surface. Thereafter, a cutting process is performed on the conductive frame to form a plurality of separated chip package structures.

According to an embodiment of the instant disclosure, a chip package structure adapted to be disposed on a printed circuit board is provided. The chip package structure includes a lead frame, an insulating bonding layer, a first chip, and a second chip. The lead frame has a bottom portion and a first partition plate, and the bottom portion includes a first conductive portion and a second conductive portion. The first partition plate protrudes from the second conductive portion. The insulating bonding layer is formed between the first conductive portion and the second conductive portion. The first chip is disposed on the first conductive portion so that a drain of the first chip is electrically connected to the first conductive portion. The second chip is disposed on the second conductive portion so that a drain of the second chip is electrically connected to the second conductive portion. When the chip package structure is disposed on the printed circuit board, a source of the first chip is electrically connected to the drain of the second chip by the printed circuit board, the first partition plate and the second conductive portion.

According to another embodiment of the instant disclosure, another chip package structure is provided. The chip package structure includes a lead frame and a chip disposed on the bottom portion is provided, in which the lead frame has a bottom portion and a partition plate. The partition plate is electrically connected to the bottom portion and a chip disposed on the bottom portion, wherein a drain of the chip is electrically connected to the bottom portion so that the partition plate is electrically connected to the drain of the chip.

In the manufacturing method of a chip package structure according to an embodiment of the instant disclosure, the conductive frame replaces the molding compound to package the chip so as to reduce the use of the molding compound and minimize the impact of pollution on the environment. In addition, different chip package structures can be formed by changing the cutting position during the cutting process.

In order to further the understanding regarding the instant disclosure, the following embodiments are provided along with illustrations to facilitate the disclosure of the instant disclosure.

DETAILED DESCRIPTION OF THE PREFERRED EMBODIMENTS

Figure 1:
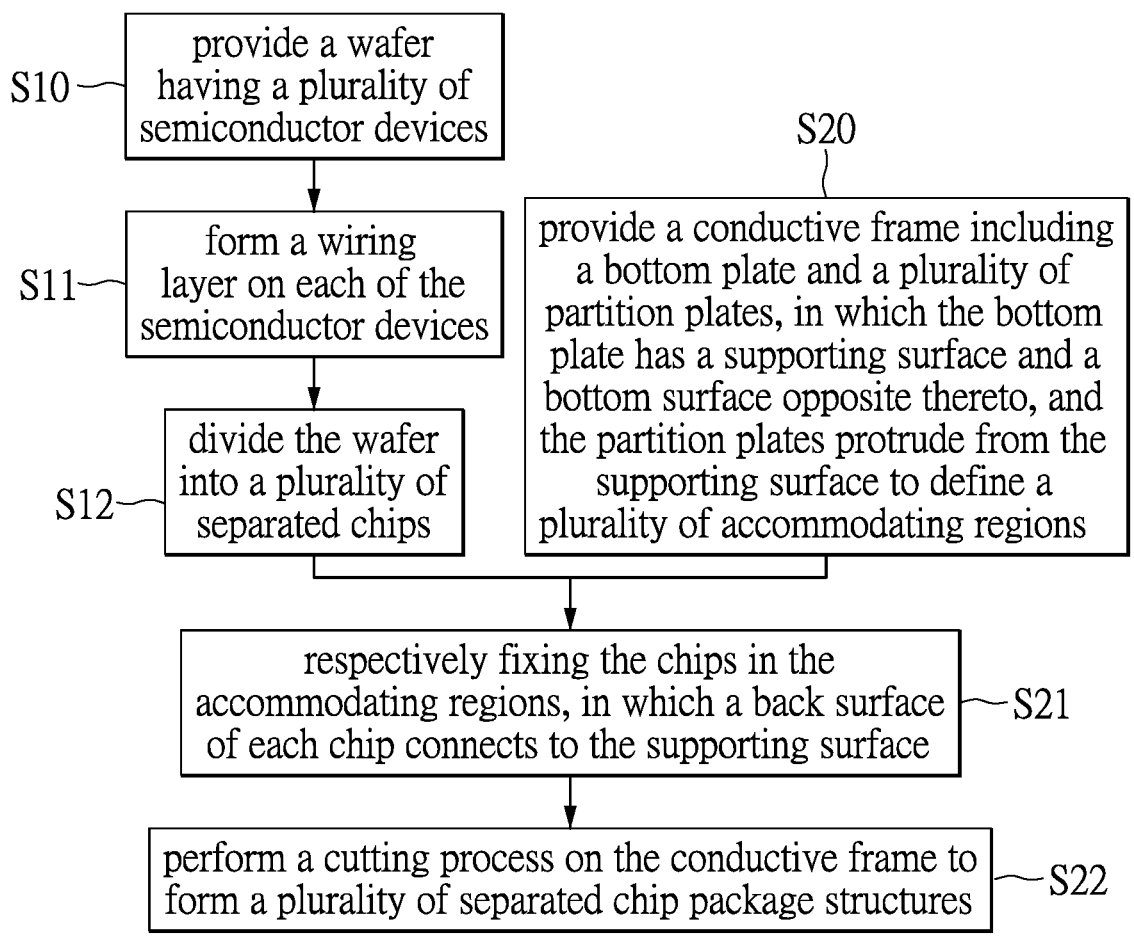
FIG. 1 shows a flow chart of the manufacturing method of a chip package structure in accordance with an embodiment of the instant disclosure.

Please refer to FIG. 1. FIG. 1 shows a flow chart of the manufacturing method of a chip package structure in accordance with an embodiment of the instant disclosure. The manufacturing method of the chip package structure can be performed to package the same or different types of chips, such as a power transistor, integrated circuit device, diode device, and so on. The power transistor can be a vertical power transistor, an insulated gate bipolar transistor (IGBT) or a bottom-source lateral diffusion MOSFET In step S10, a wafer having a plurality of semiconductor devices is provided. The material of the wafer is usually silicon or another semiconductor material, such as GaAs, GaN, or SiC. In the instant embodiment, the wafer has an original thickness ranging from 350 to 680 μm. Additionally, fabrication processes of a device have been performed on the wafer so that the wafer has a plurality of semiconductor devices formed thereon.

In step S11, a wiring layer is formed on each semiconductor device. The wiring layer can include a plurality of under bump metallization (UBM) pads and a plurality of pads, in which the pads are respectively disposed on the UBM pads. In another embodiment, the wiring layer can be a redistribution layer (RDL). In step S12, the wafer is divided into a plurality of separated chips.

In step S20, a conductive frame is provided. The conductive frame includes a bottom plate and a plurality of partition plates. The bottom plate has a supporting surface and a bottom surface opposite to the supporting surface, and the partition plates are disposed on the supporting surface to define a plurality of accommodating regions. The detailed structure of the conductive frame will be explained in the following description.

In step S21, the chips are respectively fixed in the accommodating regions, and a back surface of each chip is connected to the supporting surface. Subsequently, in step S22, the conductive frame is cut to form a plurality of separated chip package structures, in which each chip package structures includes a lead frame, which is formed by cutting the conductive frame.

The following description further explains the details in each of steps shown in FIG. 1. Please refer to FIG. 2 and FIG. 3, which respectively show sectional views of a localized chip package structure in different steps of the manufacturing method shown in FIG. 1. In the instant embodiment, only two semiconductor devices S1 of the wafer are illustrated in the sectional view. The semiconductor device S1 can be a vertical metal-oxide-semiconductor field-effect transistor (MOSFET), a control chip or a diode device. In the instant embodiment, the semiconductor device is the vertical MOSFET.

Because the wafer has been grinded and the fabrication processes of the semiconductor device have been completed, each semiconductor device S1 includes a patterned protective layer (not shown), a gate 101, and a source 102 formed on an active surface 10 thereof. In addition, each semiconductor device S1 also includes a back electrode layer formed on a back surface 11 thereof to serve as a drain.

Figure 2:
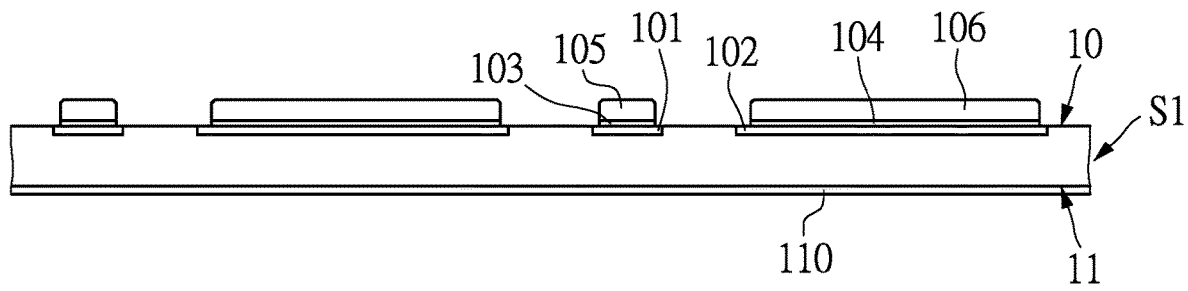
FIG. 2 shows a sectional view of a localized chip package structure in a step of a manufacturing method shown in FIG. 1.

Please refer to FIG. 2. In the instant embodiment, the step of forming the wiring layer on each semiconductor device S1 includes the steps of forming a plurality of UBM pads 103, 104 respectively on the gate 101 and source 102, and subsequently forming a plurality of pads respectively on the UBM pads 103, 104.

The UBM pads 103, 104 can be formed by electroless plating, sputtering, evaporating, and so on. In one embodiment, the UBM pads 103, 104 can be made of nickel-gold (NiAu) alloy or titanium-copper (TiCu) alloy. Furthermore, the UBM pads 103, 104 can be made of another alloy or have a laminated layer structure.

Subsequently, the pads are respectively formed on the UBM pads 103, 104 to connect to serve as the contacts for connecting an external circuit. In the instant embodiment, one of the pads is a gate pad 105, and another one of the pads is a source pad 106. The pads can be formed by a process forming solder bumps or attaching solder balls. In addition, the copper pillar bump process or gold bump process or electroplating process can be performed to form the pads.

Figure 3:
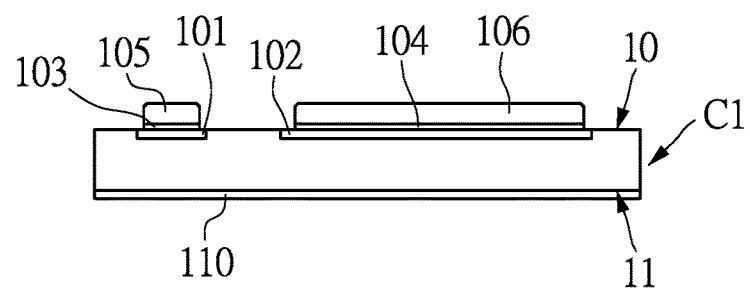
FIG. 3 shows a sectional view of a localized chip package structure in a step of a manufacturing method shown in FIG. 1.

In another embodiment, the step of forming the pads 105, 106 respectively on the UBM pads 103,104 can be omitted under the conditions that enough solder paste and flux have been formed on the corresponding contact positions of the printed circuit board, and high alignment accuracy between the pads and the contact positions is not required during the subsequent process of disposing the semiconductor device S1 on the printed circuit board. Subsequently, as mentioned in step S20, the conductive frame is cut to form a plurality of separated chips C1, as shown in FIG. 3.

Figure 4A:
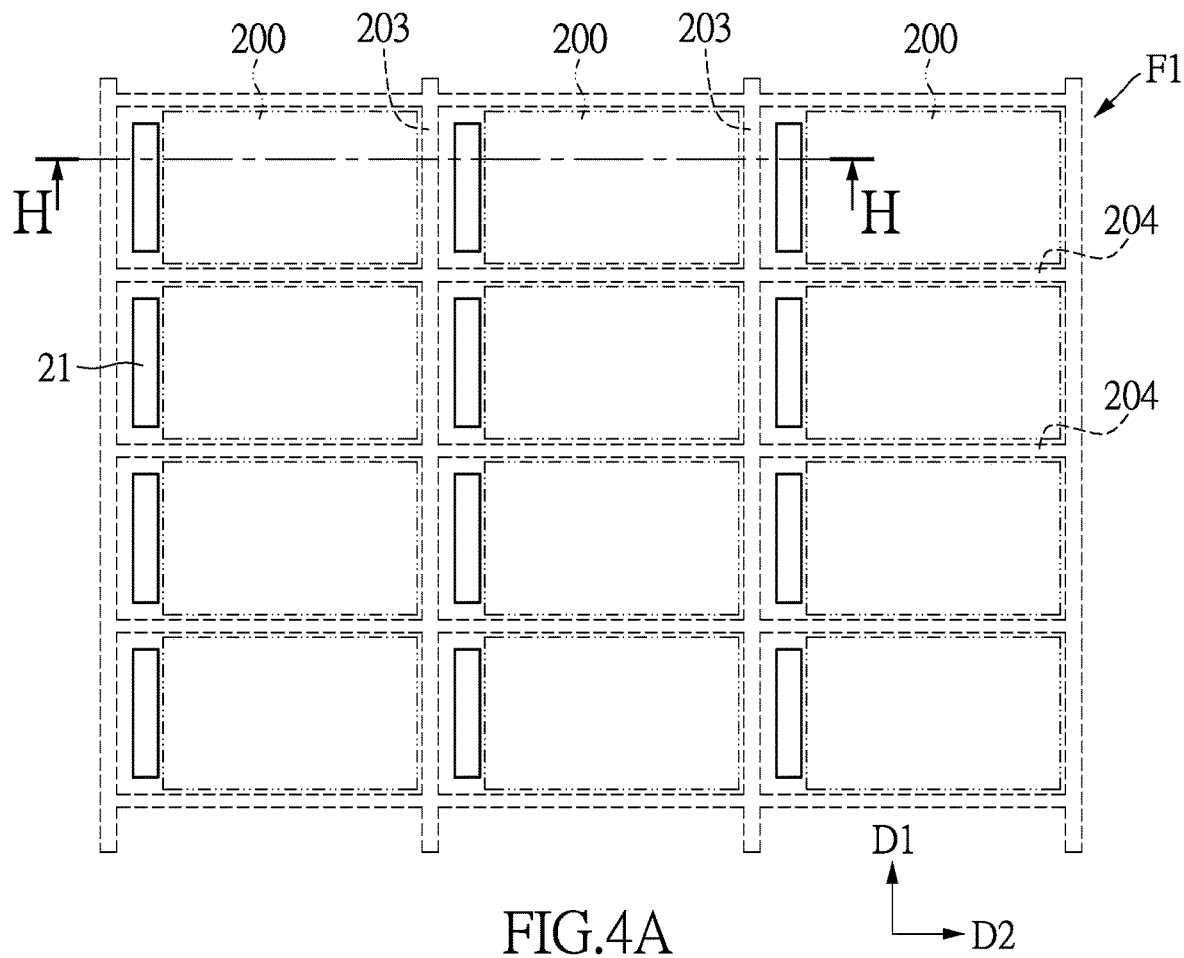
FIG. 4A shows a top view of a localized conductive frame in accordance with an embodiment of the instant disclosure.

Please refer to FIG. 1. As mentioned in step S20, the conductive frame is provided. Please refer to FIG. 4A and FIG. 4B. FIG. 4A shows a top view of a localized conductive frame in accordance with an embodiment of the instant disclosure, and FIG. 4B shows a sectional view taken along a line H-H in FIG. 4A.

The conductive frame F1 can be made of copper, iron, nickel or an alloy thereof. In the instant embodiment, the conductive frame is made of copper alloy and has a thickness ranging from 25 to 500 μm. In addition, the conductive frame F1 can be fabricated by, but is not limit to, etching, punching, or stamping. In one embodiment, the conductive frame F1 can be made of copper or copper alloy coated with nickel, or another metal or non-metal material on the outer surface thereof to prevent the oxidation of the copper and bad appearance.

Figure 4B:
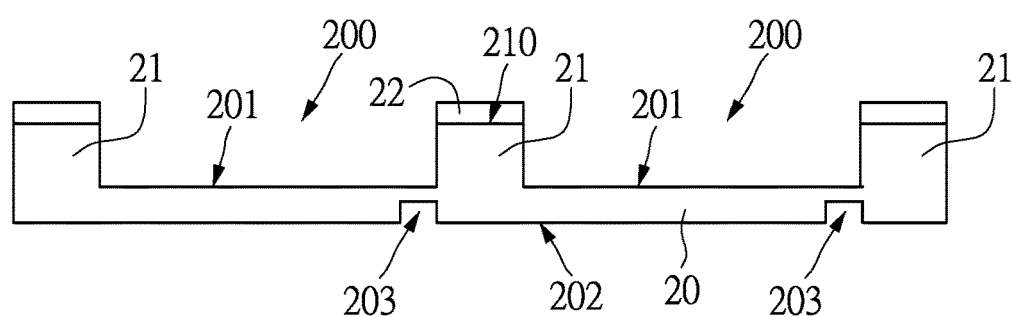
FIG. 4B shows a sectional view taken along a line H-H in FIG. 4A.

Please refer to FIG. 4A and FIG. 4B. The conductive frame F1 provided in the instant embodiment includes a bottom plate 20 and a plurality of partition plates 21. As shown in FIG. 4B, the bottom plate 20 has a supporting surface 201 and a bottom surface 202 opposite thereto. In addition, the partition plates 21 protrude from the supporting surface 201 to define a plurality of accommodating regions 200.

Specifically, the conductive frame F1 has a rim (not shown), and the rim and the bottom plate 60 commonly define an arrangement space, and the partition plates 21 divide the arrangement space into the accommodating regions 200, which are in fluid communication with each other. In the instant embodiment, the partition plates 21 are arranged in an array form on the bottom plate 20, and each of the partition plates 21 in each row has a longitudinal axis extending along a first direction D1. In addition, two of the immediately adjacent partition plates 21 arranged along a second direction D2 can be separated from each other by a space which may be slightly larger than the width of each chip.

Figure 4C:
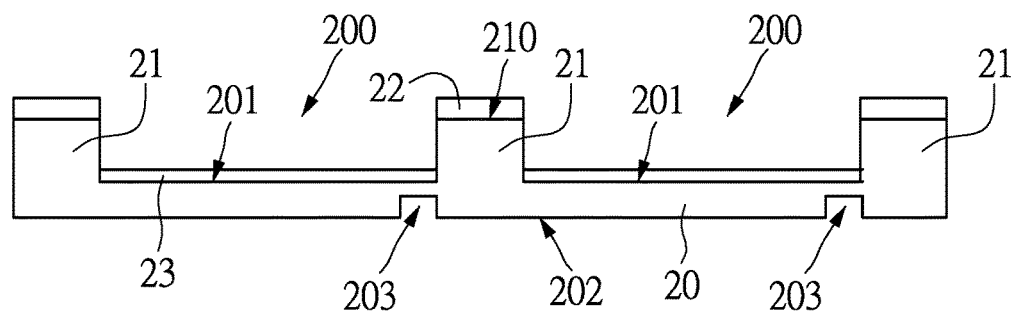
FIG. 4C shows a sectional view of a localized conductive frame in accordance with another embodiment of the instant disclosure.

Furthermore, each partition plate 21 has an ending surface 210, and the ending surface 210 can be optionally coated with a conductive layer 22. The conductive layer 22 can be made of metal material, such as nickel, tin, silver or an alloy thereof which are more easily attached to the contact positions of the printed circuit board. In addition, please refer to FIG. 4C, which shows a sectional view of a localized conductive frame in accordance with another embodiment of the instant disclosure. In the present embodiment, another conductive layer 23 can be optionally coated on the supporting surface 201 to mate with the property of an adhesive by which the chip adheres to the supporting surface 201.

Subsequently, take the conductive frame shown in FIG. 4A and FIG. 4B as an example for description. Please refer to FIG. 4B. The bottom surface 202 of the bottom plate 20 has a plurality of first cutting grooves 203 and a plurality of second cutting grooves 204 corresponding to the accommodating region 200 pre-formed thereon. The first cutting grooves 203 intersect with the second cutting grooves 204 to form the boundaries of each chip package structure. Additionally, the positions of the first cutting grooves 203 and the second cutting grooves 204 are staggered with respect to the positions of the partition plates 21.

In one embodiment, the first cutting grooves 203 are arranged in parallel and extend along a first direction D1. Additionally, the second grooves 204 are arranged in parallel and extend along a second direction D2. In one embodiment, each of the first cutting grooves 203 and the second cutting grooves 204 has a width of about 50 μm. In another embodiment, the first cutting grooves 203 and the second cutting grooves 204 can be omitted.

In another embodiment, the bottom surface 202 of the bottom plate 20 can include a plurality of cutting marks pre-formed thereon. In one embodiment, the cutting mark is a notch to define the position of the opening pattern formed in the subsequent steps.

Figure 5A:
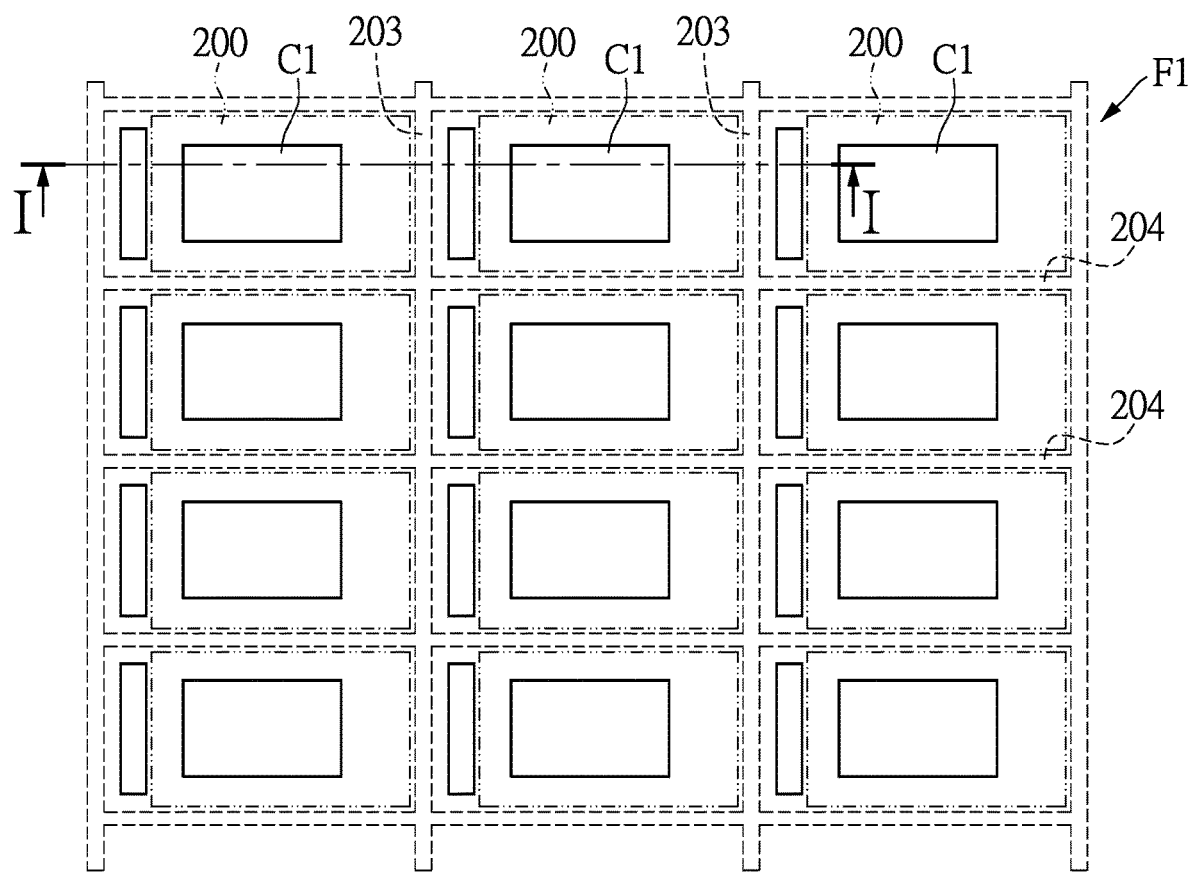
FIG. 5A shows a top view of the chip package structure in a step of the manufacturing method in FIG. 1 in accordance with an embodiment of the instant disclosure.
Figure 5B:
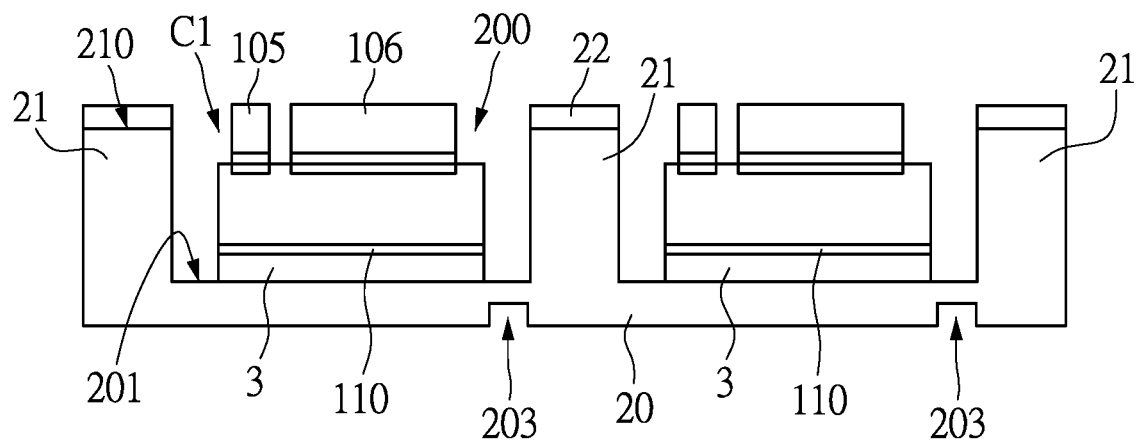
FIG. 5B shows a sectional view taken along a line I-I in FIG. 5A.

Please refer to FIG. 5A and FIG. 5B. FIG. 5A shows a top view of localized chip package structure in the step S21 of the manufacturing method in FIG. 1 in accordance with an embodiment of the instant disclosure, and FIG. 5B shows a sectional view taken along a line I-I in FIG. 5A.

As shown in FIG. 5A, the chips C1 are respectively fixed in the accommodating regions 200, and each chip C1 is arranged on the supporting surface 201 with the back surface 11 facing to the supporting surface 201. In the instant embodiment, take the chip C1 shown in FIG. 3 as an example for description.

A plurality of chips C1 are formed by cutting the wafer, and the chips C1 are respectively arranged in the accommodating regions 200 of the conductive frame F1, respectively. In another embodiment, after cutting the same or different wafers, the different or the same kinds of chips can be reconfigured in the accommodating regions 200 of the conductive frame F1. The chips may be the same or different semiconductor devices, such as power transistors, integrated circuit devices, or diode devices, and so on. The power transistor is, for example, a vertical power transistor, an insulated gate bipolar transistor (IGBT), or a bottom-source lateral diffusion MOSFET.

That is to say, these chips are respectively fixed in the corresponding accommodating regions of the conductive frame F1 according to the practical requirements, which will be explained in detail by examples in the following description.

In the instant embodiment, each chip C1 is fixed in the corresponding accommodating region 200 by applying an adhesive 3. The adhesive 3 can be selected from conductive paste or insulation paste according to the kinds of the chips and the circuit design requirements. In the instant embodiment, the chip C1 is vertical MOSFET, and the adhesive is conductive paste, such as a silver paste, nano-silver containing paste, sintering silver paste, tin paste, a copper paste, or the like. In another embodiment, when the chip is the control chip, the adhesive 3 is insulation paste. After the chip C1 is attached to the supporting surface 201 by the adhesive 3, the adhesive 3 is cured by performing a thermal process or a reflow process so that the chip C1 is reliably fixed on the conductive frame F1. The adhesive 3 can be formed by dispensing or screen printing.

Notably, when the chip C1 is fixed on the supporting surface 201 by the adhesive 3, the drain 110 of the chip C1 can be electrically connected to the bottom plate 20 of the conductive frame F1 so as to electrically connect to the partition plate 21. When the chip C1 is assembled on the printed circuit board, the conductive layer 22 formed on the ending surface 210 of the partition plate 21 can serve as a drain pad of the chip C1. In another embodiment, when the chip is a control chip, the adhesive is an insulation paste to insulate the chip from the conductive frame F1, in which the insulation paste can be a heat dissipation adhesive.

Figure 5C:
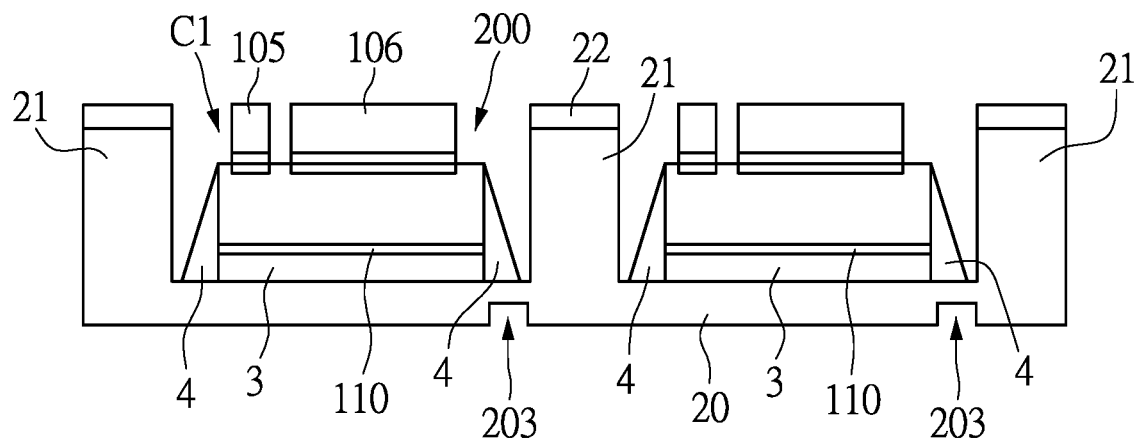
FIG. 5C shows a sectional view of the localized package structure in a step of the manufacturing method in FIG. 1 in accordance with an embodiment of the instant disclosure.

Subsequently, please refer to FIG. 5C, which shows a sectional view of the localized package structure in a step S21 of the manufacturing method in FIG. 1 in accordance with an embodiment of the instant disclosure. If the chip C1 is desired to be operated under high voltage or in a severe environment, an insulating material 4 enclosing the sides of the chip C1 can be formed by using a dispenser to protect the chip C1.

Figure 6A:
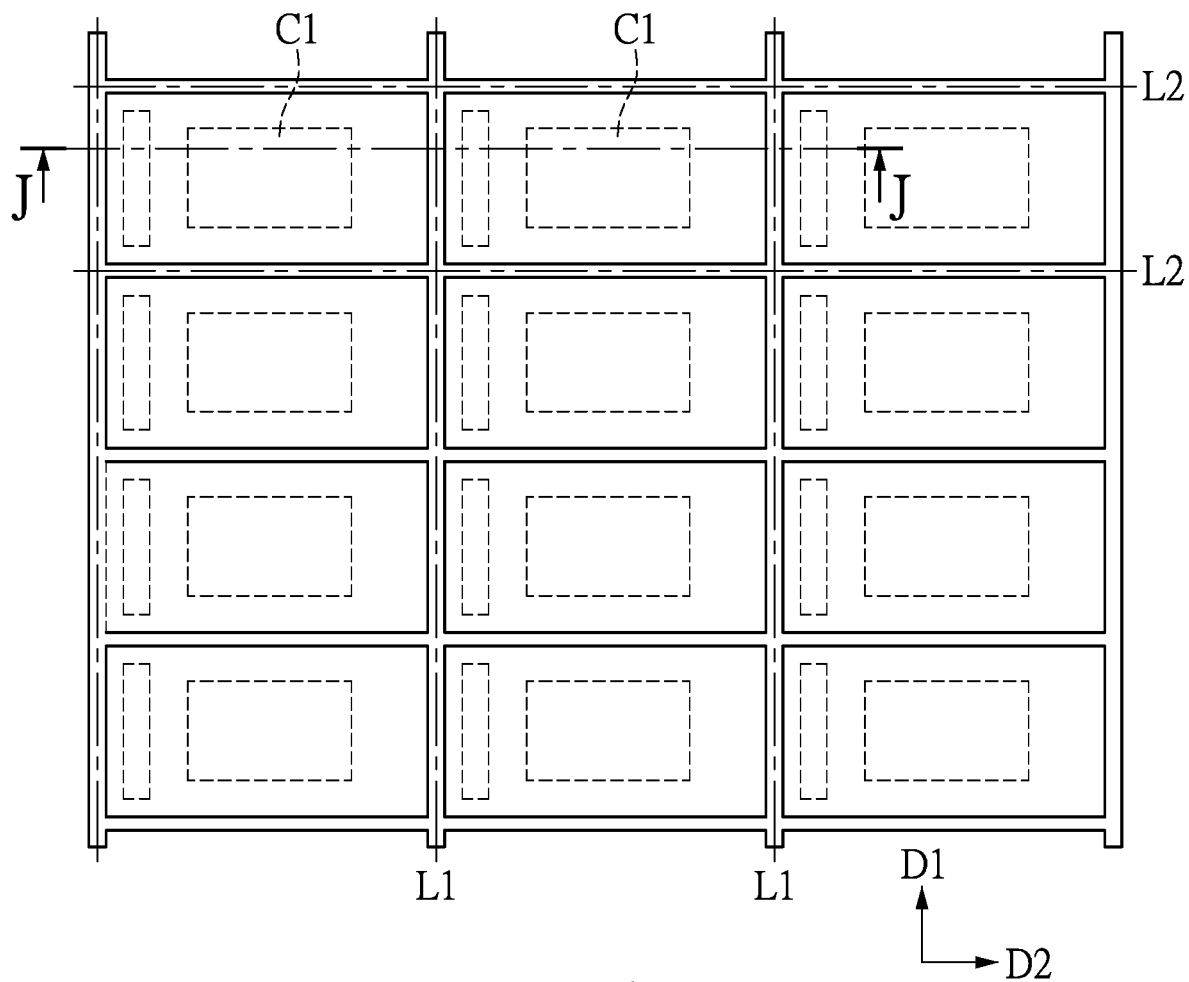
FIG. 6A shows a bottom view of the localized chip package structure in a step of the manufacturing method in FIG. 1 in accordance with an embodiment of the instant disclosure.
Figure 6B:
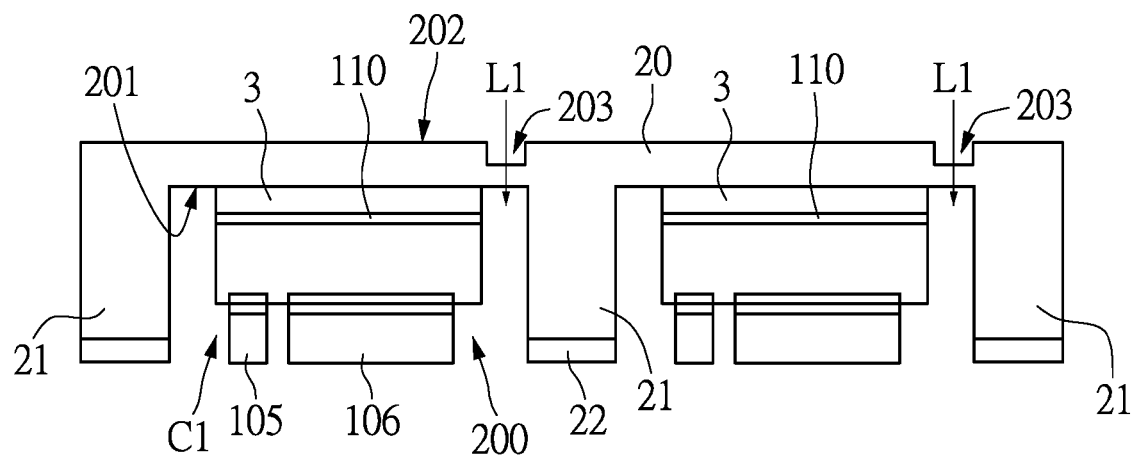
FIG. 6B shows a sectional view taken along a line J-J in FIG. 6A.

Please refer to FIG. 6A and FIG. 6B. FIG. 6A shows a bottom view of the localized chip package structure in the step S22 of the manufacturing method in FIG. 1 in accordance with an embodiment of the instant disclosure, and FIG. 6B shows a sectional view taken along a line J-J in FIG. 6A.

As shown in FIG. 6A and FIG. 6B, the conductive frame F1 is cut to form a plurality of separated chip package structures P1. The cutting process is performed on the bottom surface 202 of the conductive frame F1 by a mechanism tool (such as a diamond cutter), laser cutter or wet etching. In addition, the cutting process further includes performing a first cutting step along the first cutting lines L1 (two first cutting lines L1 are shown in FIG. 6A) in the first direction D1 according to the positions of the first cutting grooves 203, and performing a second cutting step along the second cutting lines L2 (two second cutting lines L2 are shown in FIG. 6A) in the second direction according to the positions of the second cutting grooves 204.

The chip package structure P1 fabricated by the above-mentioned method can has reduced circuit resistance and parasitic inductance. Additionally, the lead frame cut from the conductive frame can provide structural support for the chip C1 and assist heat dissipation from the chip C1. As such, the required mechanical strength of the chip package structure P1 can be maintained.

Figure 7:
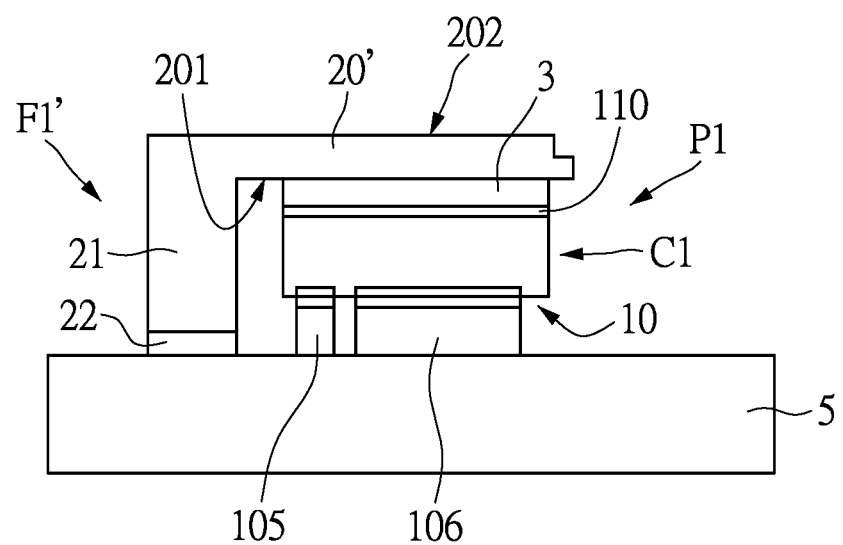
FIG. 7 shows a sectional view of the localized package structure disposed on a printed circuit board in accordance with an embodiment of the instant disclosure.

Please refer to FIG. 7, which shows a sectional view of the localized package structure disposed on a printed circuit board in accordance with an embodiment of the instant disclosure.

After the cutting process, the chip package structure P1 includes a lead frame F1', and the chip C1 fixed on the lead frame F1'. That is to say, the lead frame F1' of the chip package structure P1 is formed by cutting the conductive frame F1, and the lead frame F1' includes a bottom portion 20' (i.e., the cut bottom plate 20) and the partition plate 21.

The drain 110 of the chip C1 can be electrically connected to the bottom portion 20' and the partition plate 21. Since the drain 110 is electrically connected to the drain region of the chip, the conductive layer 22 formed on the ending surface 210 of the partition plate 21 can serve as the drain pad of the chip C1 when the chip package structure P1 is assembled on the printed circuit board.

That is to say, the gate pad 105, source pad 106 and drain pad (conductive layer 22) of the chip package structure P1 are located at the same side of the chip package structure P1 by the arrangement of the adhesive 3 and the partition plate 21 of the lead frame F1'. Accordingly, it is easier to assemble the chip package structure P1 on the printed circuit board. When the chip package structure P1 is assembled on the printed circuit board 5, the chip 5 is disposed on the printed circuit board 5 with the active surface 10 of the chip C1 facing toward the printed circuit board 5, such that the gate pad, the source pad, and the drain pad of the chip package structure P1 can be welded to the corresponding contact positions of the printed circuit board 5, respectively.

In another embodiment of the instant disclosure, different types of the chips can be assembled together by adjusting the cutting position to form different kinds of chip package structures.

Figure 8:
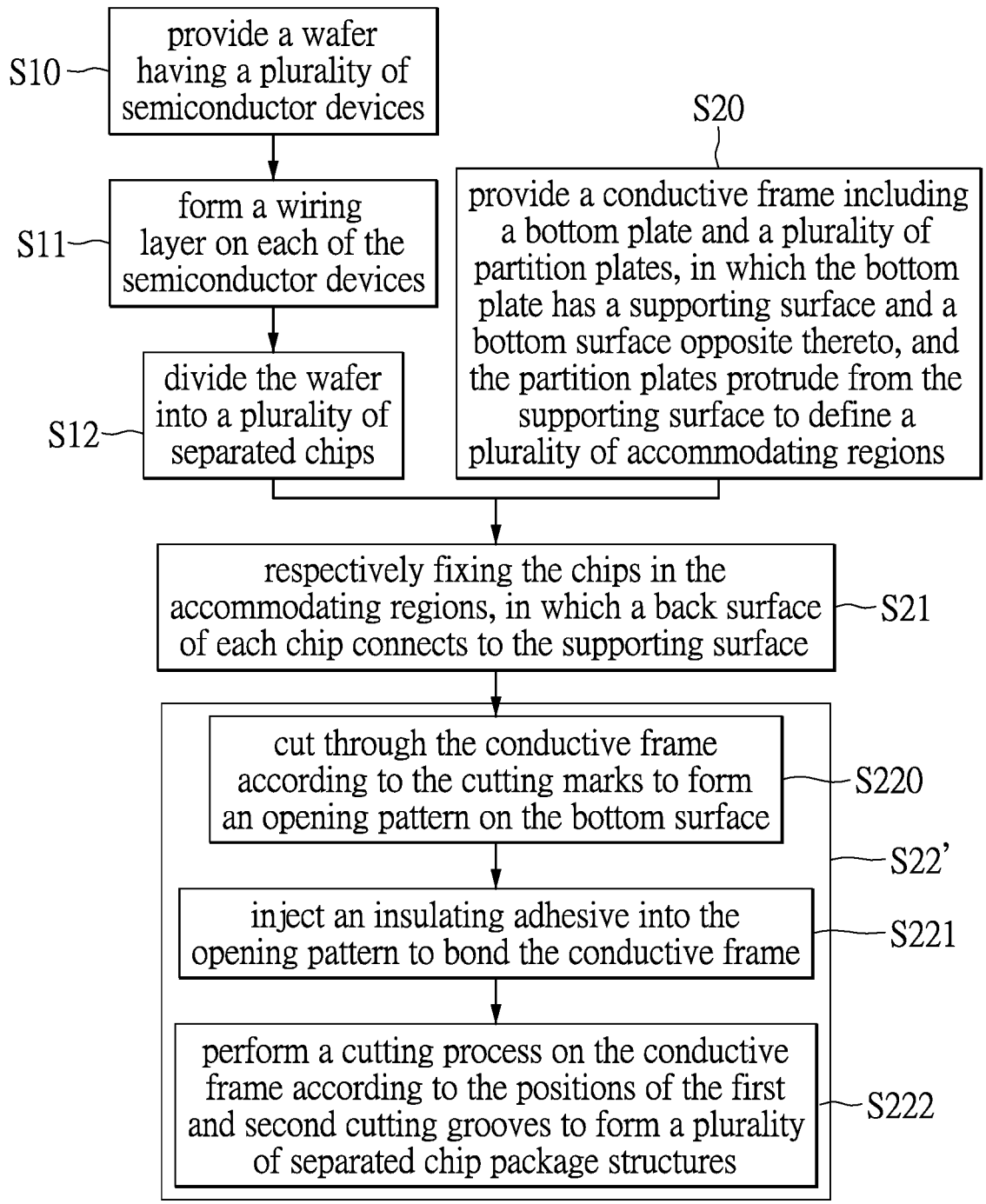
FIG. 8 shows a flow chart of the manufacturing method of a chip package structure in accordance with another embodiment of the instant disclosure.

Please refer to FIG. 8, which shows a flow chart of the manufacturing method of chip package structure in accordance with another embodiment of the instant disclosure. In the instant embodiment, the steps S10, S11, S12, S20 and S21 are similar to that of the previous embodiment shown in FIG. 1 and the relative descriptions are omitted herein.

In the embodiment, the cutting process S22' further includes the steps S220, S221, and S222. In step S220, the conductive frame is cut through according to the positions of the cutting marks to form an opening pattern on the bottom surface thereof. In step S221, an insulating adhesive is injected into the opening pattern to bond the conductive frame. In step S222, a cutting process is performed on the conductive frame according the first and second cutting grooves to form a plurality of separated chip package structures.

Figure 9A:
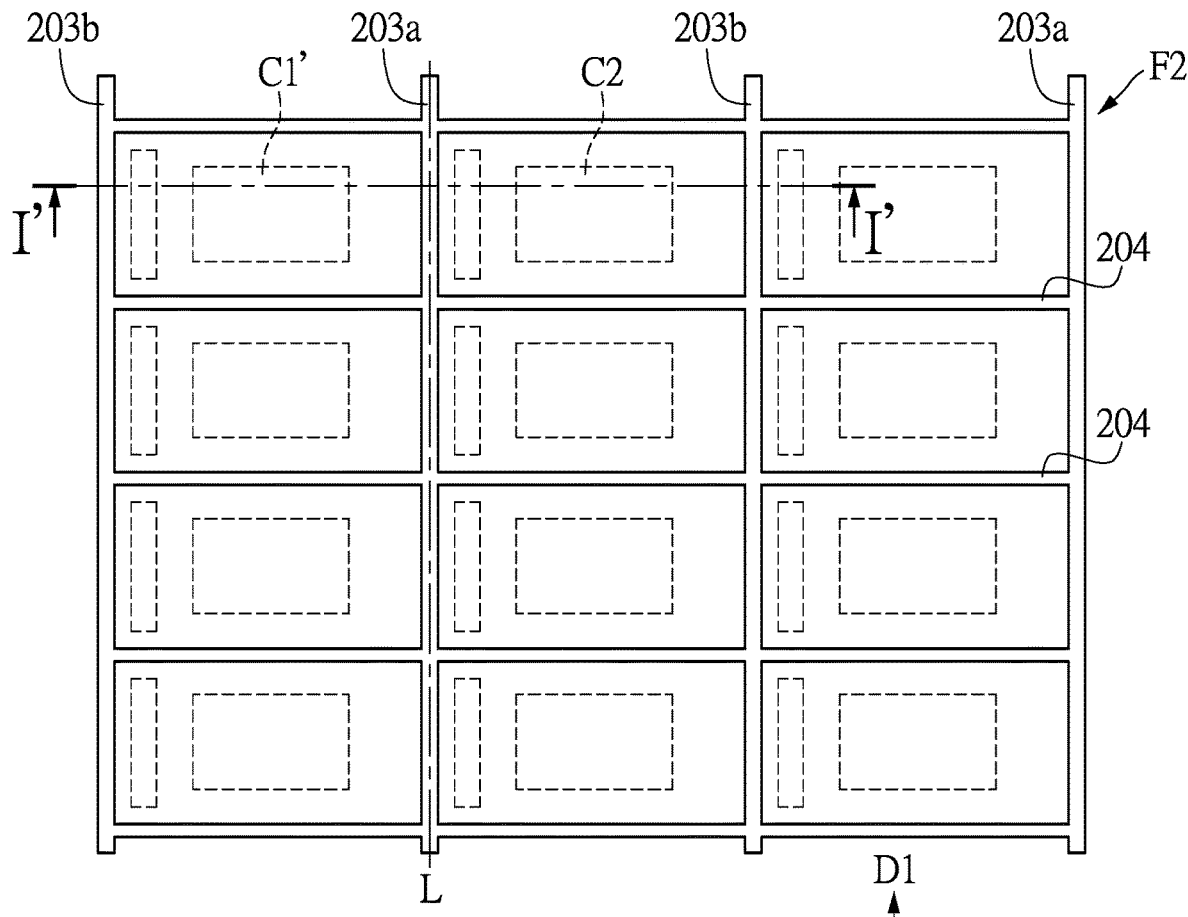
FIG. 9A shows a bottom view of a localized chip package structure in a step of the manufacturing method shown in FIG. 8.
Figure 9B:
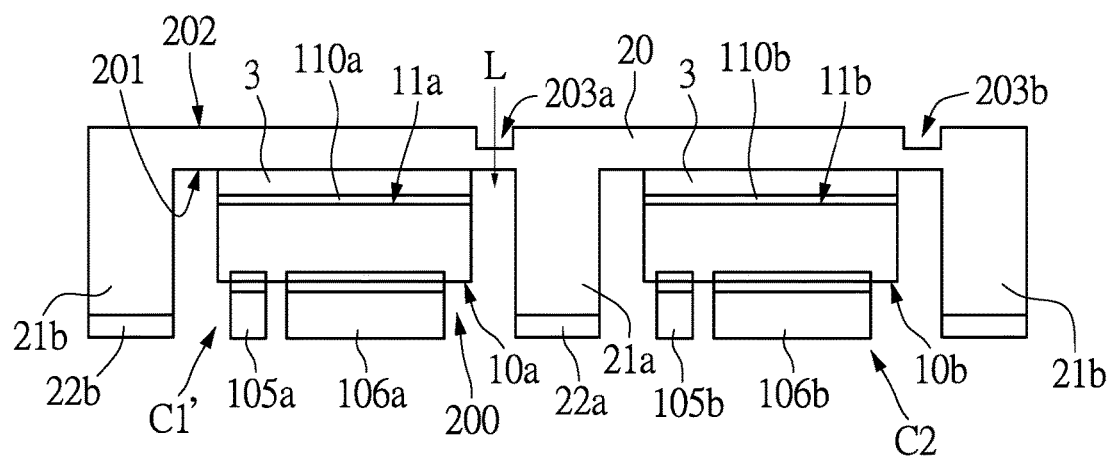
FIG. 9B shows a sectional view taken along a line I'-I' in FIG. 9A.

Please refer to FIG. 9A and FIG. 9B. FIG. 9A shows a bottom view of a localized chip package structure in the step S220 of manufacturing method shown in FIG. 8, and FIG. 9B shows a sectional view taken along a line I'-I' in FIG. 9A.

As shown in FIG. 9A and FIG. 9B, the conductive frame F2 provided in the embodiment has a plurality of cutting marks 203a, first cutting grooves 203b and second cutting grooves 204 formed on the bottom surface 202 of the bottom plate 20. The cutting mark 203a can be a stripe-shaped notch arranged parallel to the first cutting grooves 203b. In addition, the cutting marks 203a and the first cutting grooves 203b are parallel to each other and arranged alternately. In another embodiment, the cutting marks 203a can be characters, patterns, or numbers printed on the bottom surface of the conductive frame F2.

In the instant embodiment, take a first chip C1' and a second chip C2 immediately adjacent to the first chip C1' as examples for description. In one example, the first chip C1' and the second chip C2 are respectively high-side transistor and low-side transistor. Additionally, the gate (not labeled) and the source (not labeled) of the first chip C1' are formed on the active surface 10a, and the drain (not labeled) is formed on the back surface 11a of the first chip C1'. Similarly, the gate (not labeled) and the source (not labeled)

of the second chip C2 are formed on the active surface 10b, and the drain (not labeled) is formed on the back surface 11b of the second chip C2.

Furthermore, the first chip C1' has a plurality of pads formed on the active surface 10a, two of the pads respectively serve as the gate pad 105a and source pad 106a. Similarly, the second chip C2 has a plurality of pads formed on the active surface 10b, two of the pads respectively serve as the gate pad 105b and source pad 106b.

Similar to the embodiment shown in FIG. 5B, before performing the cutting process on the conductive frame F2, the first chip C1' and the second chip C2 have been respectively fixed in the two adjacent accommodating regions 200 through the adhesive 3. The adhesive 3 is conductive paste, and the two adjacent accommodating regions are arranged along the second direction D2. At this time, the drain 110a of the first chip C1' and the drain 110b of the second chip C2 are still electrically connected to each other through the conductive frame F2.

As shown in FIG. 9A and FIG. 9B, during performing the cutting process, the conductive frame F2 is cut through along a plurality of cutting lines L (only one shown in FIG. 9A) in the first direction D1 according to the positions of the cutting marks 203a to form the opening pattern on the bottom surface 202 of the conductive frame F2. Notably, the bottom plate 20 of the conductive frame F2 is divided into a plurality of separated portions so that the drain 110a of the first chip C1' and the drain 110b of the second chip C2 are insulated from each other. In the instant embodiment, the opening pattern includes a plurality of first trenches. The first trenches and the first cutting grooves 203b are parallel to each other and arranged alternately.

Figure 10A:
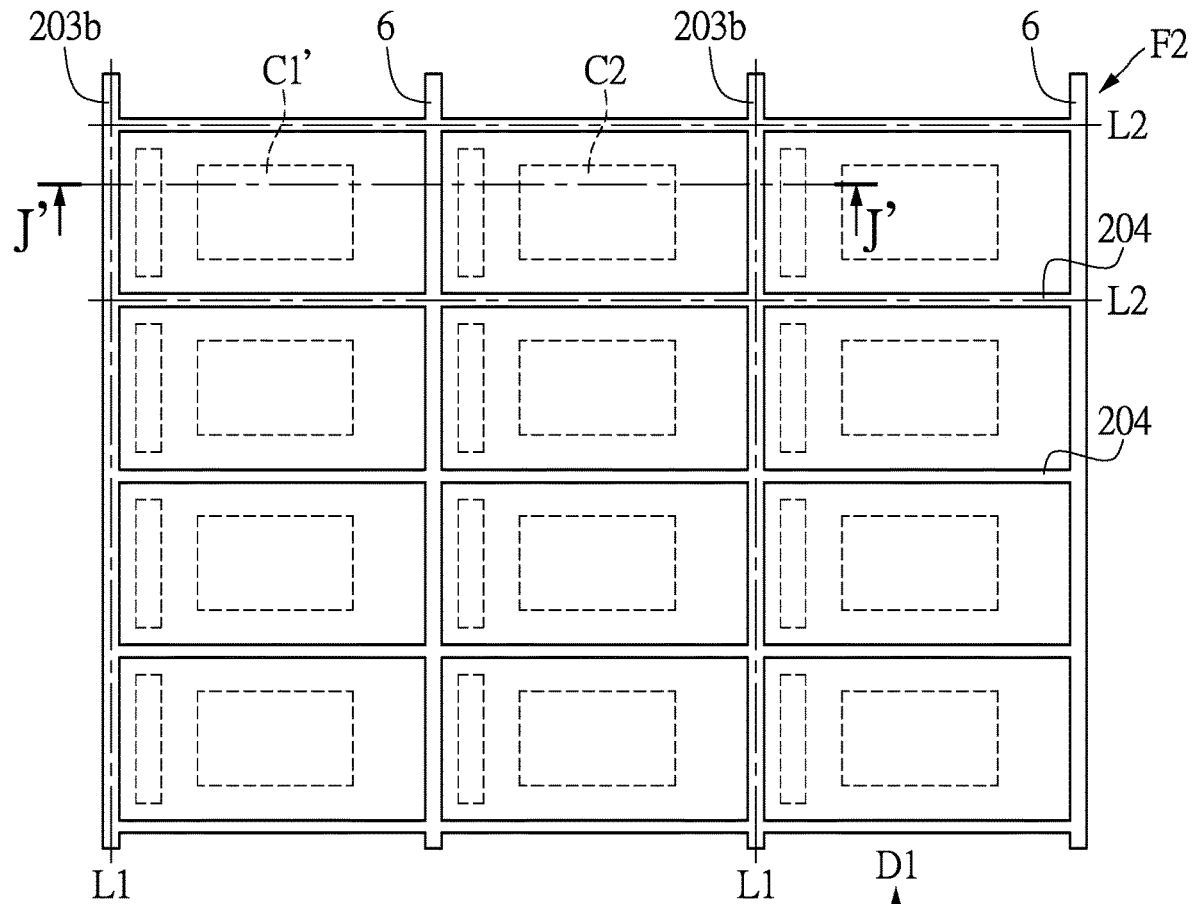
FIG. 10A shows a bottom view of a localized package structure in a step of the manufacturing method shown in FIG. 8.

Subsequently, please refer to FIG. 10A and FIG. 10B. FIG. 10A shows a bottom view of a localized package structure in the step S221 of the manufacturing method shown in FIG. 8, and FIG. 10B shows a sectional view taken along a line J'-J' in FIG. 10A.

Figure 10B:
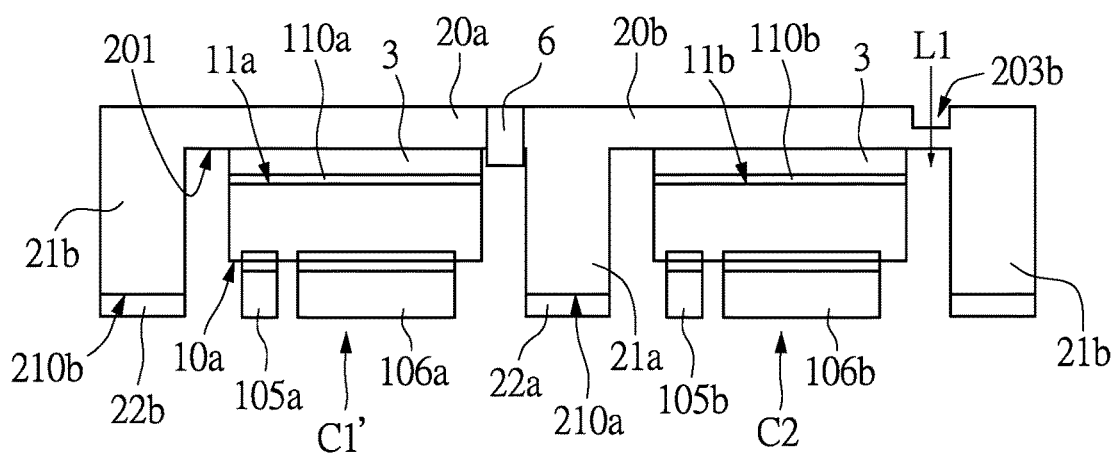
FIG. 10B shows a sectional view taken along a line J'-J' in FIG. 10A.

As shown in FIG. 10A and FIG. 10B, the insulating adhesive is injected into the opening pattern to form an insulating pattern 6. Specifically, the opening pattern can be filled with the insulating adhesive by an encapsulation machine or by partially dipping the conductive frame F2 in the insulating adhesive. After the step of injecting the insulating adhesive into the opening pattern, a curing process is performed to bond the separated pieces of the conductive frame F2 together again. In this case, the drain of the first chip C1' and the drain of the second chip C2 are insulated from each other instead of being electrically connected through the conductive frame F2.

Subsequently, a cutting through step is performed on the conductive frame F2 along the first cutting lines L1 in the first direction D1 and the second cutting lines L2 in the second direction D2 according to the positions of the first and second cutting grooves 203b, 204 to form a plurality of separated chip package structures P2.

Figure 11:
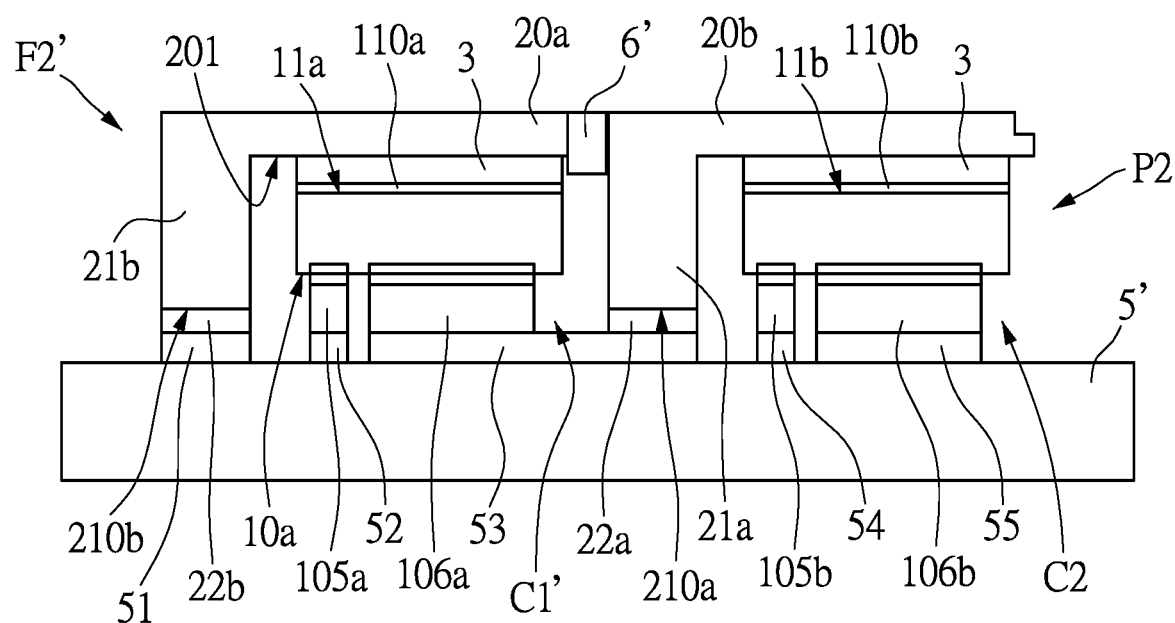
FIG. 11 shows a sectional view of the localized package structure disposed on a printed circuit board in accordance with another embodiment of the instant disclosure.

Please refer to FIG. 11, which shows a sectional view of the localized package structure disposed on a printed circuit board in accordance with another embodiment of the instant disclosure. The chip package structure P2 can be assembled on a printed circuit board 5' and adapted to a voltage convertor circuit. The chip package structure P2 includes a first lead frame F2', an insulating bonding layer 6', the first chip C1', and the second chip C2.

Specifically, the first lead frame F2' is formed by performing the abovementioned cutting process on the conductive frame F2. The first lead frame F2' includes a bottom portion and a first partition plate 21a. The bottom portion includes a first conductive portion 21a and a second conductive portion 21b, and the first partition plate 21a protrudes from the second conductive portion 20b.

The insulating bonding layer 6' is arranged between the first and second conductive portions 20a, 20b so that the first and second conductive portions 20a, 20b are bonded together and insulated from each other.

It is worth noting that after the steps of performing the cutting process, injecting the insulating adhesive into the opening pattern, and curing the insulating adhesive to form the insulating bonding layer, the bottom plate 20 of the conductive frame F2 is cut to form the bottom portion having the first conductive portion 20a and the second conductive portion 20b. The first and second conductive portions 20a, 20b are separated from each other. The insulating adhesive layer 6' is arranged between the first and second conductive portions 20a and 20b to insulate the first conductive portion 20a from the second conductive portion 20b. Furthermore, the first partition plate 21a is still electrically connected to the second conductive portion 20b.

The first chip C1' is disposed on the first conductive portion 20a, and the drain 110a of the first chip C1' is electrically connected to the first conductive portion 20a by the adhesive 3. Similarly, the second chip C2 is disposed on the second conductive portion 20b, and the drain 110b of the second chip C2 is electrically connected to the second conductive portion 20b by the adhesive 3.

Since the first partition plate 21a is electrically connected to the second conductive portion 20b, the first partition plate 21a is also electrically connected to the drain 110b of the second chip C2. Furthermore, the chip package structure P2 of the instant embodiment further includes a second partition plate 21b. The second partition plate 21b is disposed at one side of the first lead frame F2' and electrically connected to the first conductive portion 20a. That is to say, the first chip C1' is arranged in the accommodating region 200 which is defined by the first partition plate 21a, the second partition plate 21b and the bottom portion.

When the chip package structure P2 is disposed on the printed circuit board 5' and implemented in the voltage convertor circuit, the source pad 106a of the first chip C1' can be electrically connected to the drain 110b of the second chip C2 through the printed circuit board 5', the first partition plate 21a, and the second conductive portion 20b.

Please refer to FIG. 11. Specifically, the printed circuit board 5' includes a plurality of pads formed thereon, in which the pads at least include a VIN pad 51, a high-side gate pad 52, a switch contact pad 53, a low-side gate pad 54, and a ground pad 55. When the chip package structure P2 is disposed on the printed circuit board 5' with a positive surface (the surface located at one side opposite to the bottom of the first lead frame F2') facing to the printed circuit board 5', the second partition plate 21b is bonded to the VIN pad 51 through the conductive layer 22b, and the gate pad 105a of the first chip C1' is bonded to the high-side gate pad 52. Furthermore, the source pad 106a and the conductive layer 22a of the first partition plate 21a are commonly bonded to the switch contact pad 53, and the gate pad 105b and the source pad 106b of the second chip C2 are respectively bonded to the low-side gate pad 54 and ground pad 55. As such, the chip package structure P2 can be directly implemented in the voltage convertor circuit.

Figure 12A:
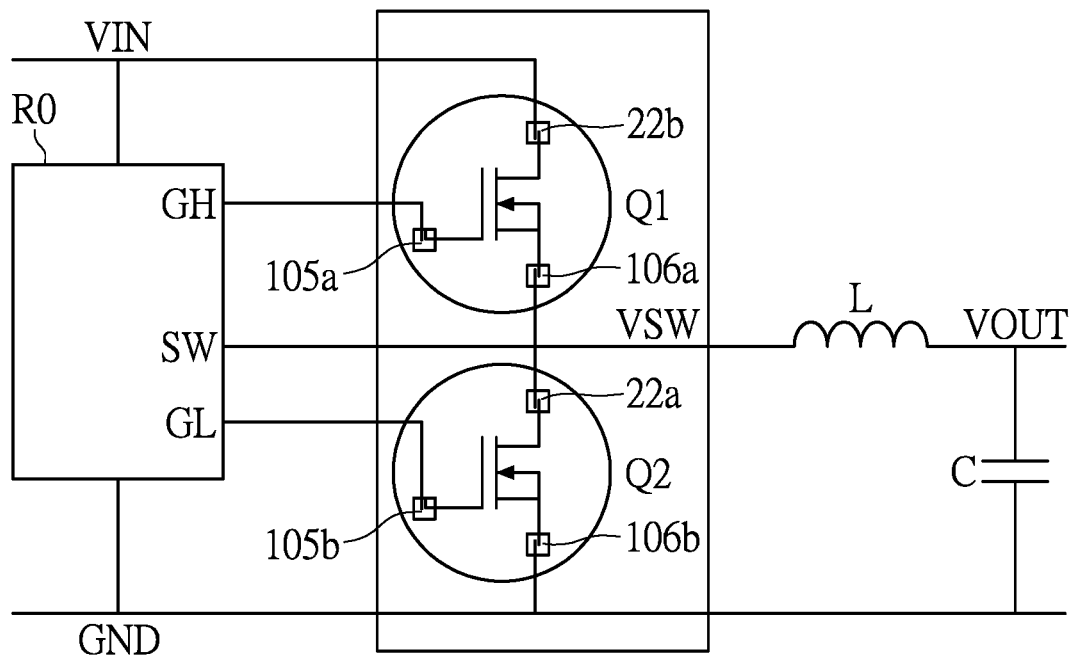
FIG. 12A shows a schematic diagram of a chip package structure implemented in a circuit in accordance with an embodiment of the instant disclosure.
Figure 12B:
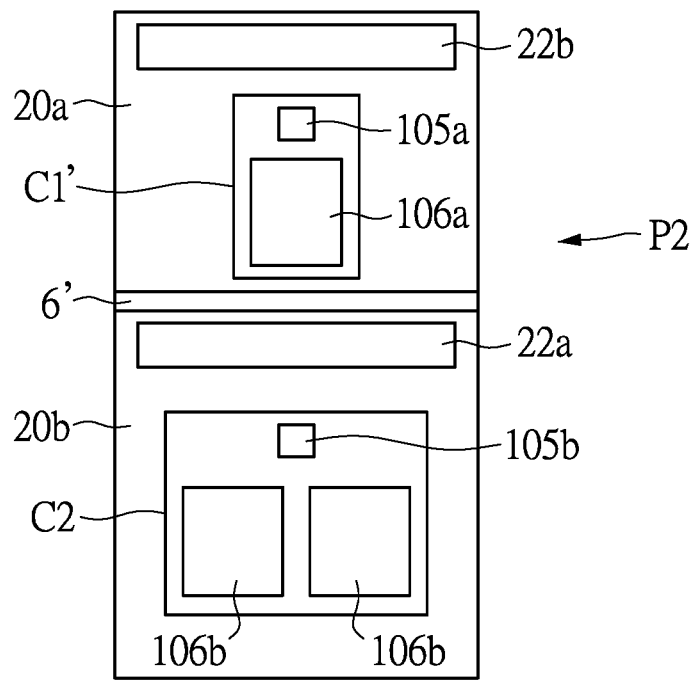
FIG. 12B shows a top view of a chip package structure in accordance with another embodiment of the instant disclosure.

Please refer to FIG. 12A and FIG. 12B. FIG. 12A shows a schematic diagram of a chip package structure implemented in a circuit in accordance with an embodiment of the instant disclosure, and FIG. 12B shows a top view of a chip package structure in accordance with another embodiment of the instant disclosure.

As shown in FIG. 12A and FIG. 12B, each pad of the chip package structure P2 can serve as a contact point for electrically connecting an external circuit. For example, a control device R0 has a VIN pin, a GH pin, a SW pin, a GL pin, and a GND pin. The VIN pin can be electrically connected to the conductive layer 22b of the second partition plate 21b, the GH pin can be electrically connected to the gate pad 105a of the first chip C1', the SW pin can be electrically connected to the source pad 106a of the first chip C1' and the conductive layer 22a of the first partition plate 21a, and the GND pin can be electrically connected to the source pad 106b of the second chip C2.

That is to say, in the chip package structure fabricated by the manufacturing method of the chip package structure according to the embodiment of the instant disclosure, the electrical connections between the chips have been established by the lead frame. Accordingly, the chip package structure provided by the embodiment of the instant disclosure is a half-finished electronic device in reality, and can be directly implemented in the circuit.

Figure 13A:
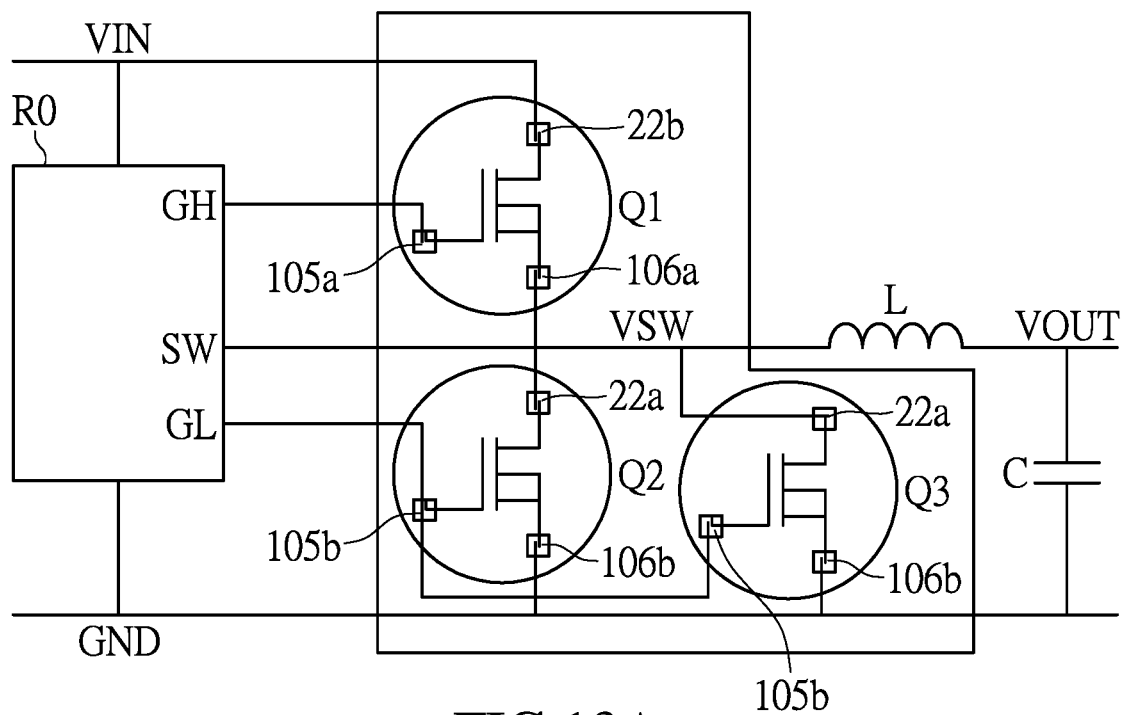
FIG. 13A shows a schematic diagram of a chip package structure implemented in a circuit in accordance with another embodiment of the instant disclosure.
Figure 13B:
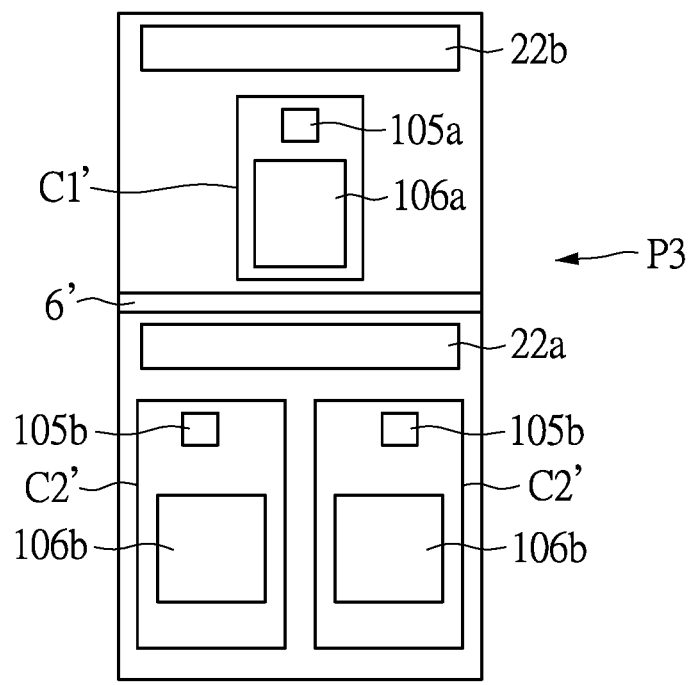
FIG. 13B shows a top view of a chip package structure in accordance with another embodiment of the instant disclosure.

Please refer to FIG. 13A and FIG. 13B. FIG. 13A shows a schematic diagram of a chip package structure implemented in a circuit in accordance with another embodiment of the instant disclosure, and FIG. 13B shows a top view of a chip package structure in accordance with another embodiment of the instant disclosure.

Another type of the voltage convertor circuit is shown in FIG. 13A. Compared to the voltage convertor circuit shown in FIG. 12A, three power transistors are applied in the voltage convertor circuit shown in FIG. 13A, one of the power transistors is high-side MOSFET, and the others are low-side MOSFETs.

In the instant embodiment, the chip package structure P3 implemented in the voltage convertor circuit shown in FIG. 13A can be formed by suitable designs of the cutting positions. The chip package structure P3 includes one first chip C1' and two second chips C2', and both of the drains of the two second chips C2' are electrically connected to the second conductive portion 20b. In the instant embodiment, the chip package structure P3 can be formed by the same cutting process as the previous embodiment.

Figure 14A:
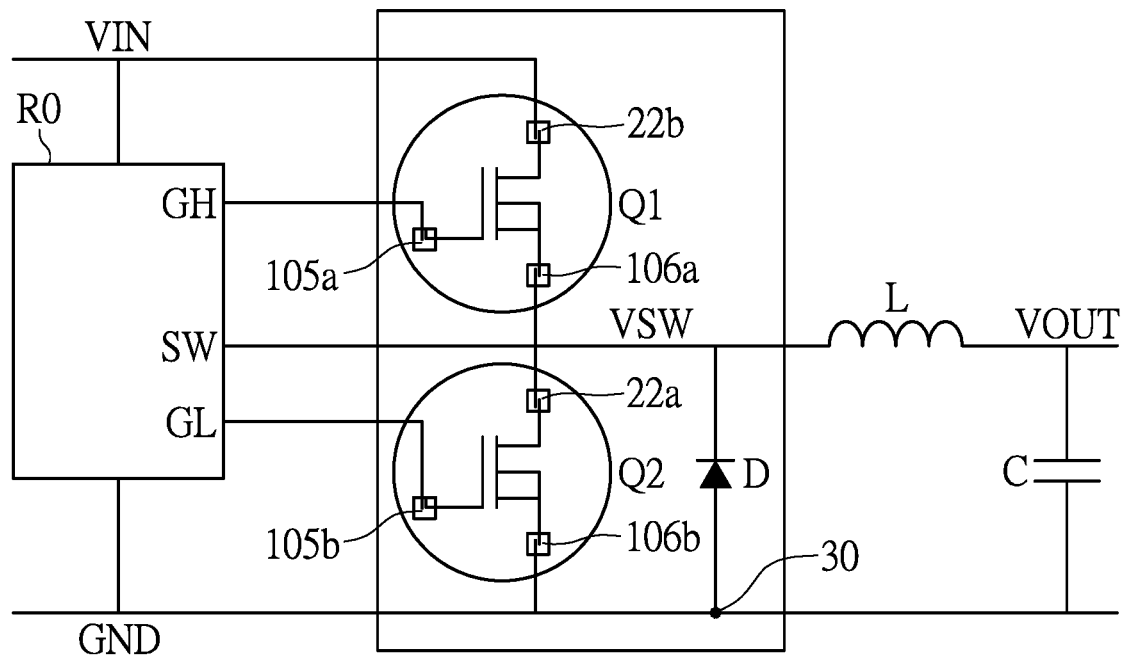
FIG. 14A shows a schematic diagram of a chip package structure implemented in a circuit in accordance with another embodiment of the instant disclosure.
Figure 14B:
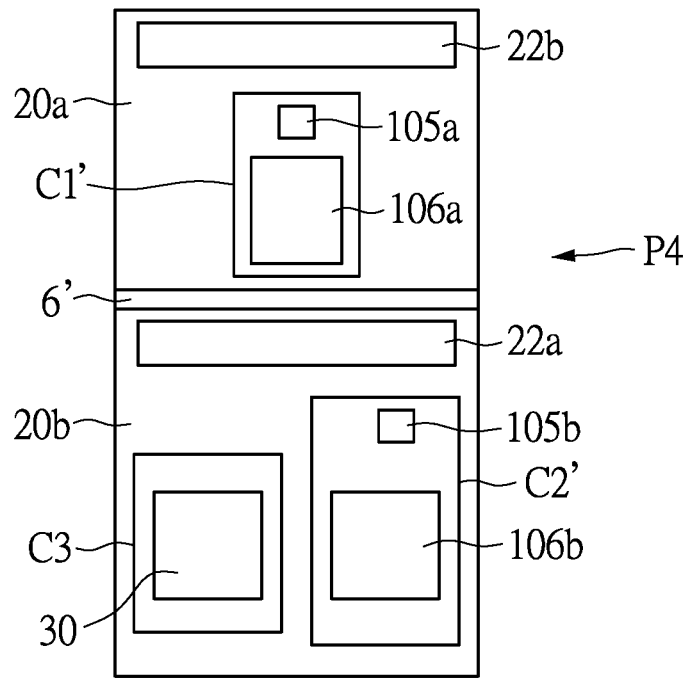
FIG. 14B shows a top view of a chip package structure in accordance with another embodiment of the instant disclosure.

Additionally, the chip package structure can further include a third chip in addition to the first and second chips. Please refer to FIG. 14A and FIG. 14B. FIG. 14A shows a schematic diagram of a chip package structure implemented in a circuit in accordance with another embodiment of the instant disclosure, and FIG. 14B shows a top view of a chip package structure in accordance with another embodiment of the instant disclosure. In the voltage convertor circuit shown in FIG. 14A, in addition to the high-side power MOSFET and the low-side power MOSFET, the low-side power MOSFET is connected to a diode device in parallel.

The chip package structure P4 shown in FIG. 14B includes the first chip C1', the second chip C2' and the third chip C3. The first chip C1' is disposed on the first conductive portion 20a, and the second chip C2' and the third chip C3 are disposed on the second conductive portion 20b. The second chip C2' and the third chip C3 are electrically connected to each other through the second conductive portion 20b. In the instant embodiment, both of the first and second chips C1' and C2' are power transistors, and the third chip C3 is a diode device. In addition, the first chip C1', the second chip C2' and the third chip C3 can be electrically connected to each other according to the circuit diagram shown in FIG. 14A by the lead frame and the traces configured on the printed circuit board.

As shown in FIG. 14A and FIG. 14B, the third chip C3 has a contact pad 30. Both of the contact pad 30 and the source pad 106b are electrically connected to the GND pin of the control device R0. In the instant embodiment, the chip package structure P4 can be formed by the same cutting process as the previous embodiment.

Figure 15A:
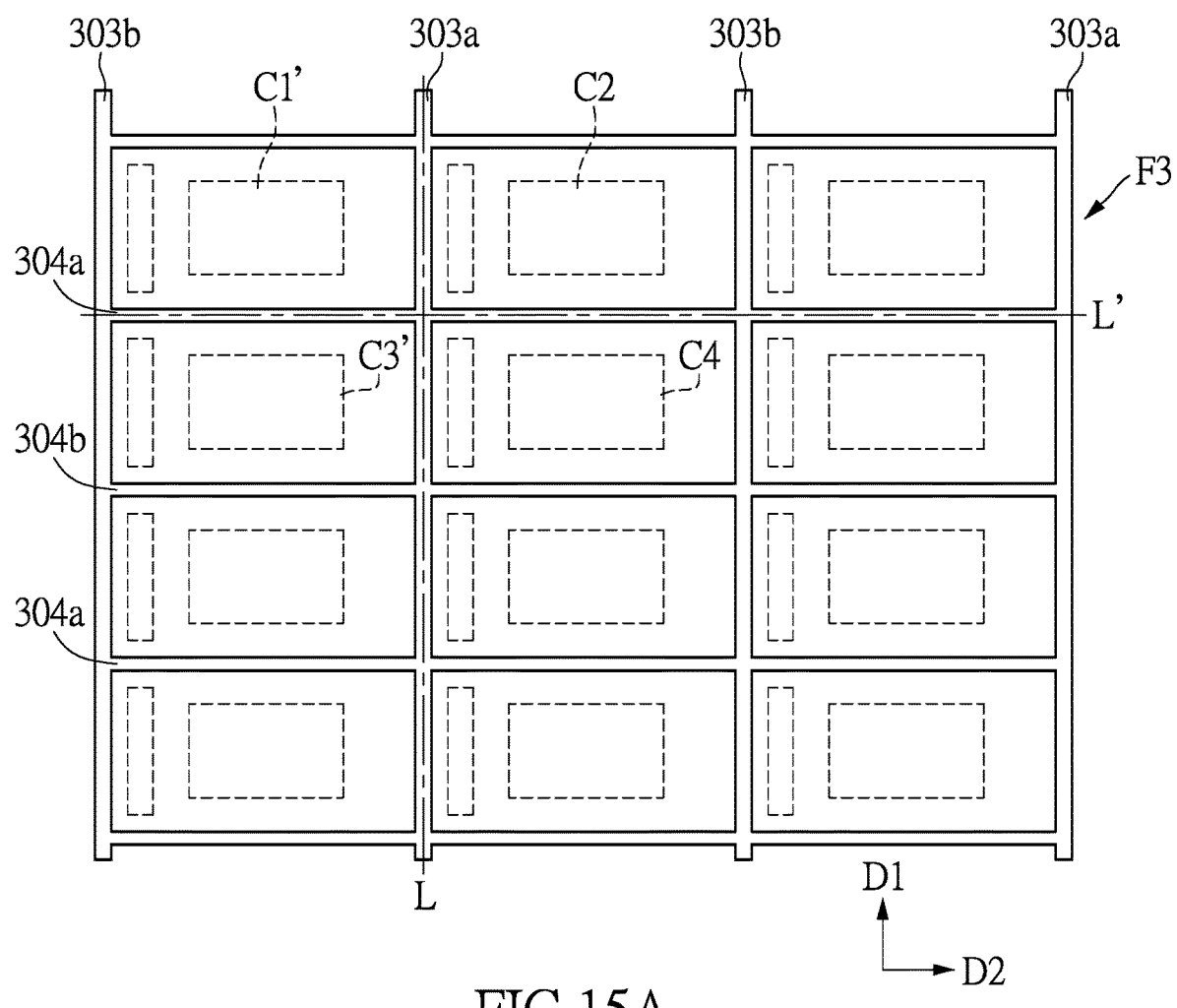
FIG. 15A shows a bottom view of a localized chip package structure in a step of the manufacturing method in FIG. 8 in accordance with another embodiment of the instant disclosure.

In another embodiment, another kind of chip package structure can be formed by changing the cutting positions. Please refer to FIG. 15A. FIG. 15A shows a bottom view of a localized chip package structure in the step S220 of the manufacturing method in FIG. 8 in accordance with another embodiment of the instant disclosure.

Compared to the conductive frame F2 shown in FIG. 9A, the conductive frame F3 shown in FIG. 15A has a plurality of cutting marks 303a extending along the first direction D1 and a plurality of cutting marks 304a extending along the second direction D2. That is, the cutting marks 303a and the cutting marks 304a respectively extend along the first and second directions D1, D2. The cutting marks 304a and the second cutting grooves 304b are parallel to each other and arranged alternately.

In the instant embodiment, the first chip C1', the second chip C2, the third chip C3' and the fourth chip C4 are commonly packaged to be applied in another kind of voltage convertor circuit. Furthermore, all of the first chip C1', the second chip C2, the third chip C3' and the fourth chip C4 are vertical power transistors.

In the embodiment shown in FIG. 15A, the cutting process is performed along the cutting lines L in the first direction D1 according to the positions of the cutting marks 303a and along the cutting lines L' in the second direction D2 according to the positions of the cutting marks 304a so as to form the opening pattern. As such, the opening pattern of the embodiment includes a plurality of first trenches (not shown) extending along the first direction D1 and a plurality of second trenches (not shown) extending along the second direction D2.

Please refer to FIG. 15A. The first and second trenches intersect with each other so that the first chip C1', the second chip C2, the third chip C3', and the fourth chip C4 are insulated from one another. Subsequently, as mentioned in the step S221 shown in FIG. 8, the opening pattern is filled with the insulating adhesive, and subsequently the insulating adhesive is cured to form an insulating pattern to bond the separated pieces of the conductive frame F3 together again.

Figure 15B:
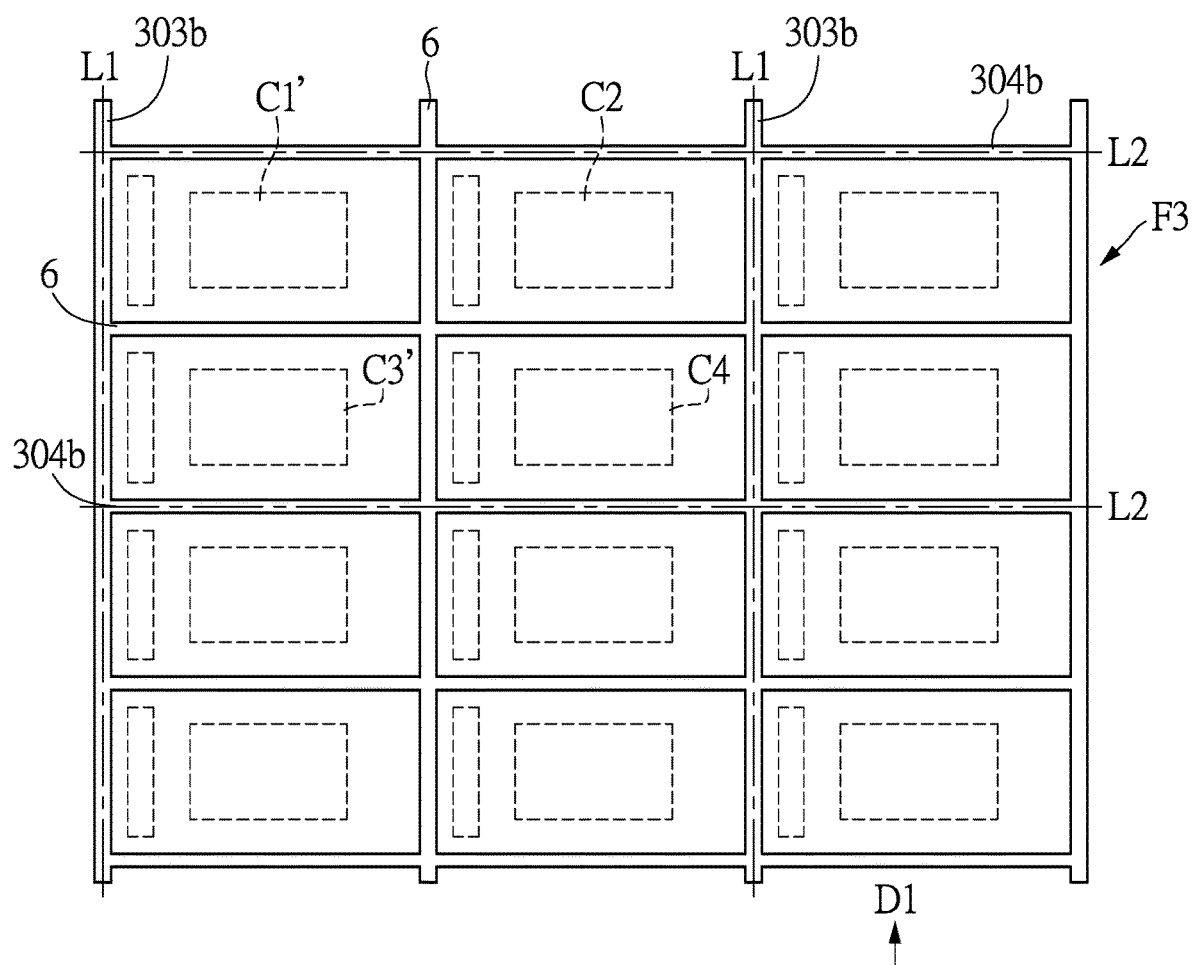
FIG. 15B shows a bottom view of a localized chip package structure in a step of the manufacturing method in FIG. 8 in accordance with another embodiment of the instant disclosure.

Please refer to FIG. 15B, which shows a bottom view of a localized chip package structure in a step of manufacturing method in FIG. 8 in accordance with another embodiment of the instant disclosure. As shown in FIG. 15, subsequently, a plurality of separated chip package structures P5 is formed by cutting the conductive frame F3 along the first cutting lines L1 in the first direction D1 and along the second cutting lines L2 according to the positions of the first cutting grooves 303b and the second cutting grooves 304b.

Figure 16A:
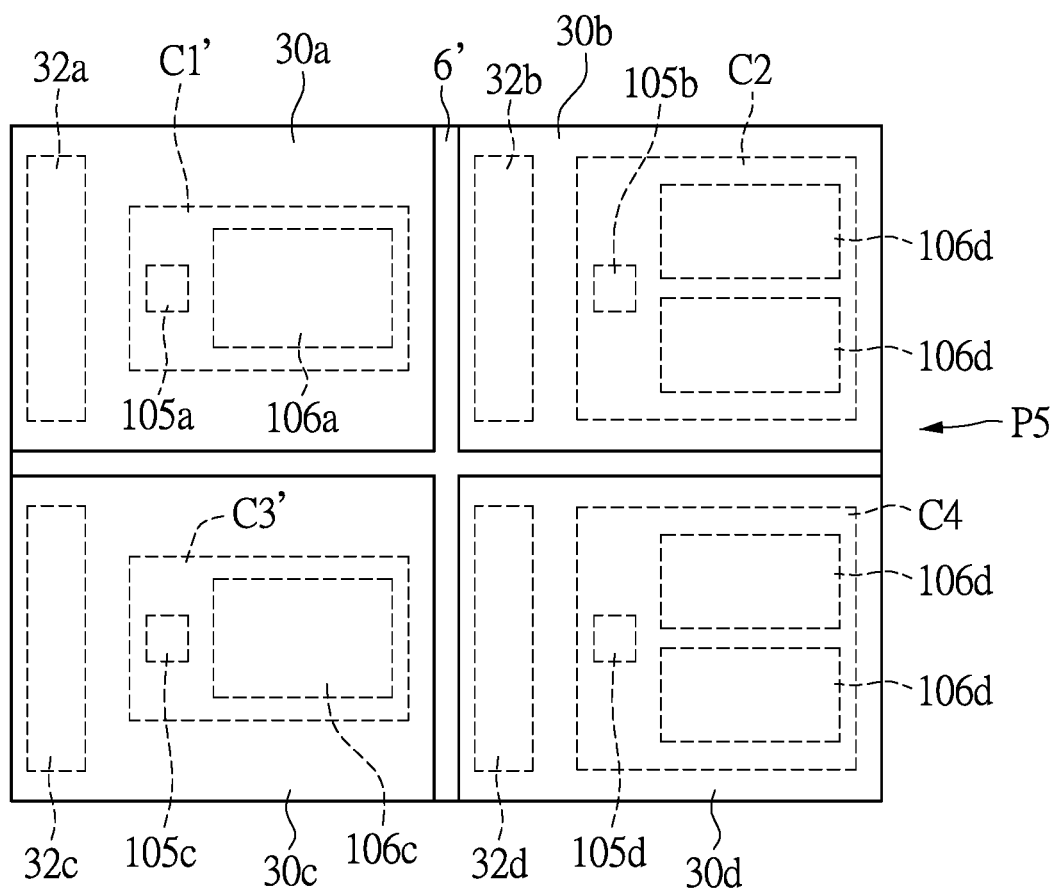
FIG. 16A shows a bottom view of a chip package structure in accordance with another embodiment of the instant disclosure.
Figure 16B:
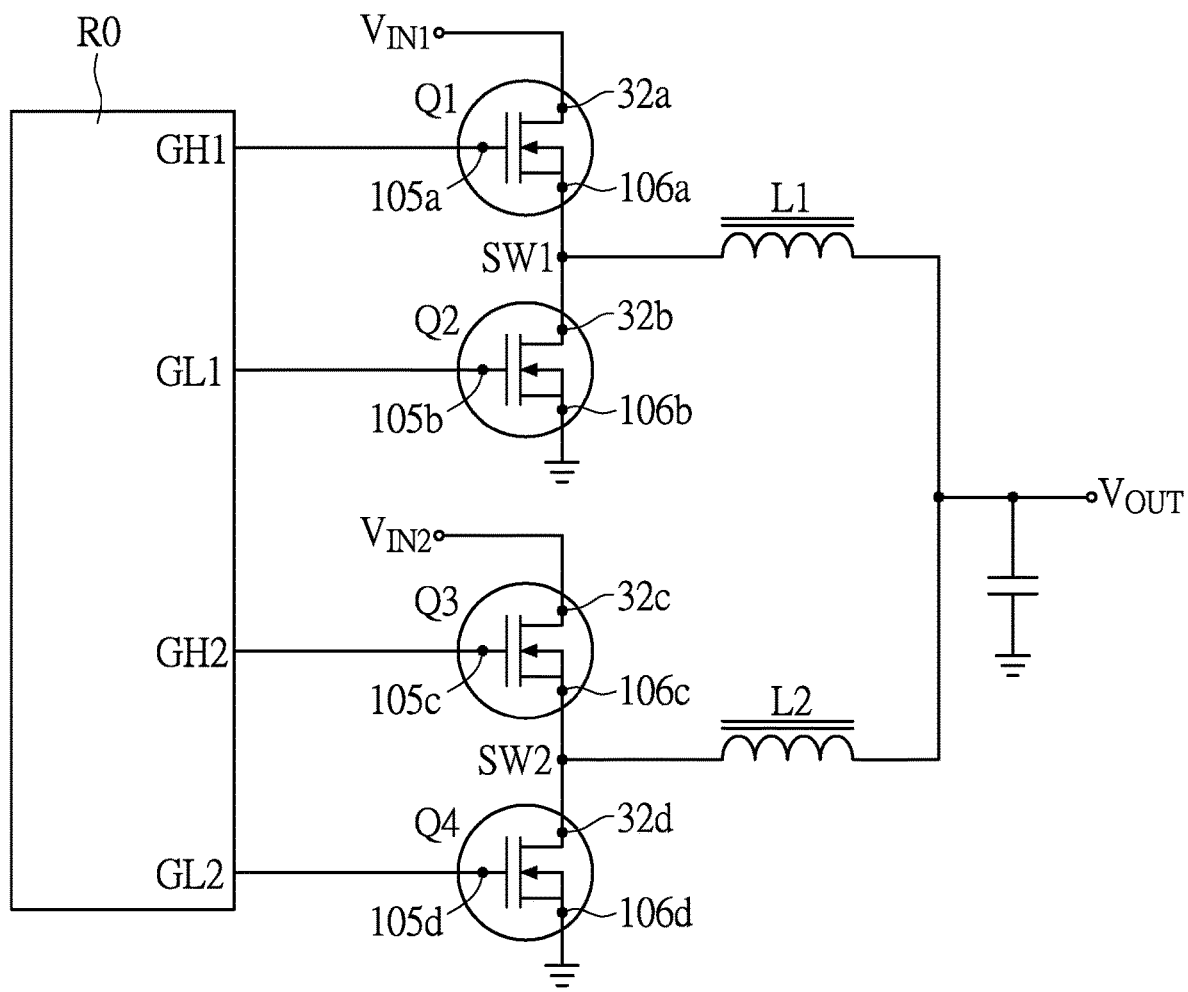
FIG. 16B shows a schematic diagram of a chip package structure implemented in a circuit in accordance with another embodiment of the instant disclosure.

Please refer to FIG. 16A and FIG. 16B. FIG. 16A shows a bottom view of a chip package structure in accordance with another embodiment of the instant disclosure, and FIG. 16B shows a schematic diagram of a chip package structure implemented in a circuit in accordance with another embodiment of the instant disclosure. The chip package structure of the instant embodiment can be applied in a multiphase control or full-bridge rectifier circuit. After the abovementioned cutting, injecting and curing processes, the chip package structure P5 includes an insulating bonding layer 6', which is formed by cutting the abovementioned insulating pattern 6. In the instant embodiment, the insulating bonding layer 6' is in a shape of a cross so that the bottom portion of the lead frame is divided into a plurality of conductive portions 30a-30d. The first chip C1', the second chip C2, the third chip C3', and the fourth chip C4 are respectively arranged on the conductive portions 30a-30d.

Furthermore, the lead frame includes a plurality of partition plates respectively disposed on the conductive portions 30a-30d, and the partition plates are respectively electrically connected to the drains of the first chip C1', the second chip C2, the third chip C3', and the fourth chip C4. The conductive layers 32a-32d are respectively formed on the top portions of the partition plates to electrically connect the contact positions on the printed circuit board.

Please refer to FIG. 16B. The chip package structure P5 can be applied in full-bridge phase-shift convertor circuit. The first chip C1', the second chip C2, the third chip C3', and the fourth chip C4 can be electrically connected to each other according to the circuit diagram shown in FIG. 16B by the lead frame and the traces configured on the printed circuit board. Each of the pads formed on the chip package structure P5 shown in FIG. 16A can serve as a contact for connecting the external circuit. In the instant embodiment, the first chip C1' and the third chip C3' can serve as high-side MOSFETs, and the second chip C2 and the fourth chip C4 can serve as low-side MOSFETs.

Accordingly, the VIN pin of the control device R0 can be electrically connected to the conductive layer 32a, the GH1 pin can be electrically connected to the gate pad 105a of the first chip C1', the SW1 pin can be electrically connected to the source pad 106a of the first chip C1' and the conductive layer 32b. The conductive layer 32b is electrically connected to the drain of the second chip C2. Additionally, the GL1 pin can be electrically connected to the gate pad 105b of the second chip C2, and the GND pin can be electrically connected to the source pad 106b of the second chip C2.

Similarly, the GH2 pin can be electrically connected to the gate pad 105c of the third chip C3, the SW2 pin can be electrically connected to the source pad 106c of the third chip C3 and the conductive layer 32c. The conductive layer 32c is electrically connected to the drain of the third chip C3. Additionally, the GL2 pin can be electrically connected to the gate pad 105d of the fourth chip C4, and the GND pin can be electrically connected to the source pad 106d of the fourth chip C4.

Figure 17A:
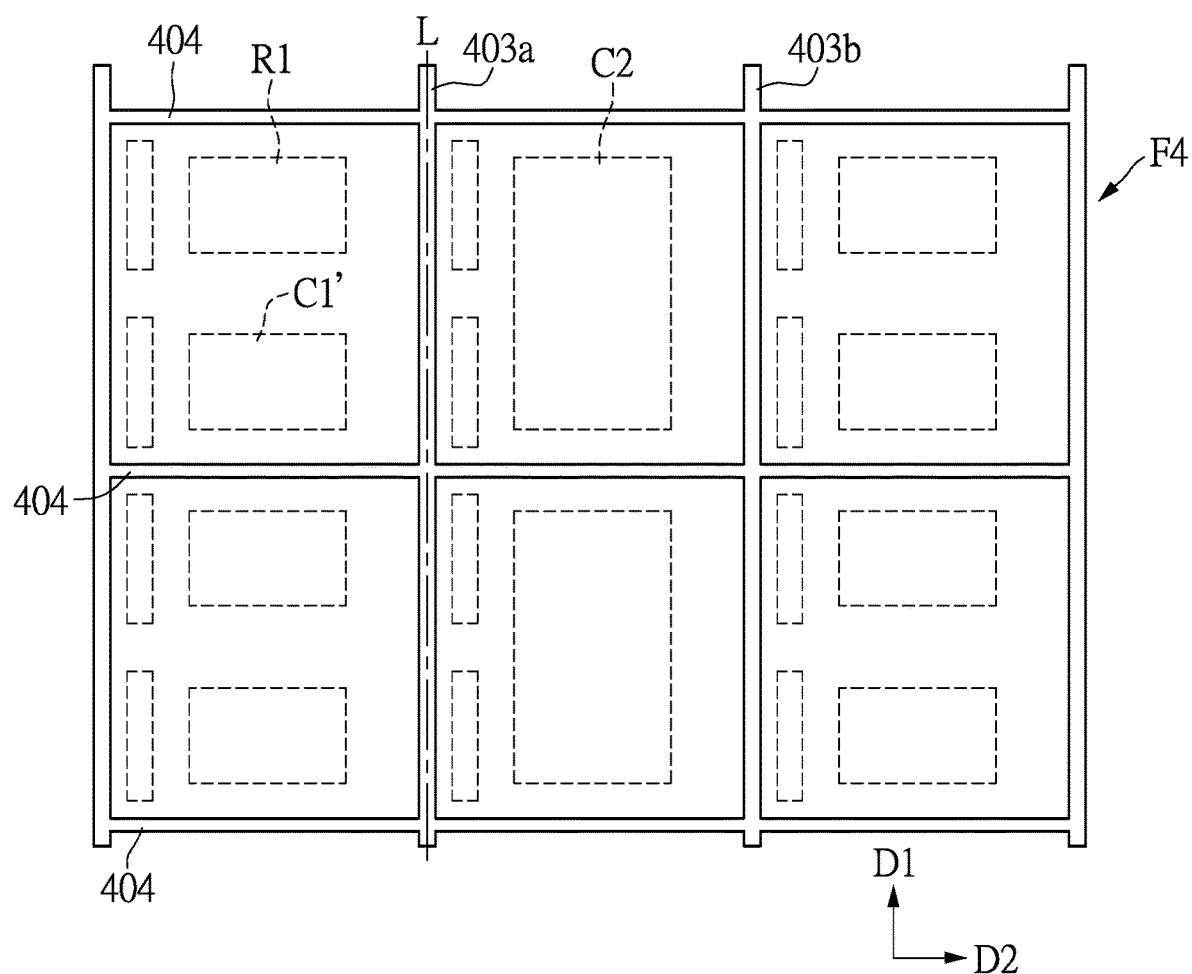
FIG. 17A shows a bottom view of a chip package structure in a step S220 of the manufacturing method in FIG. 8 in accordance with another embodiment of the instant disclosure.

In another embodiment of the instant disclosure, a control chip, high-side MOSFET and low-side MOSFET can be packaged in common chip package structure. Please refer to FIGS. 17A, 17B, and 18. FIG. 17A shows a bottom view of a chip package structure in a step S220 of the manufacturing method in FIG. 8, FIG. 17B shows a bottom view of the chip package structure in a step S222 of the manufacturing method in FIG. 8, and FIG. 18 shows a bottom view of a chip package structure.

As illustrated in FIG. 17A, the control chip R1 and the first chip C1' are respectively arranged in two adjacent accommodating regions along the first direction D1, and the second chip C2 occupies another two adjacent accommodating regions which are parallel to the control chip R1 and the first chip C1'. It is worth noting that the control chip R1 is fixed on the conductive frame F4 by the adhesive, which is insulation paste. As such the control chip R1 can be insulated from the drain of the first chip C1'.

As shown in FIG. 17A, during the step S220, the cutting process is performed along the cutting line L in the first direction D1 according to the positions of the cutting marks 403a to isolate the drain of the first chip C1' from the drain of the second chip C2 and form the opening pattern. Subsequently, in step S221, the opening pattern is filled with the insulating adhesive to bond the separated pieces of the conductive frame together again. The insulating adhesive is subsequently cured to form the insulating pattern 6.

Figure 17B:
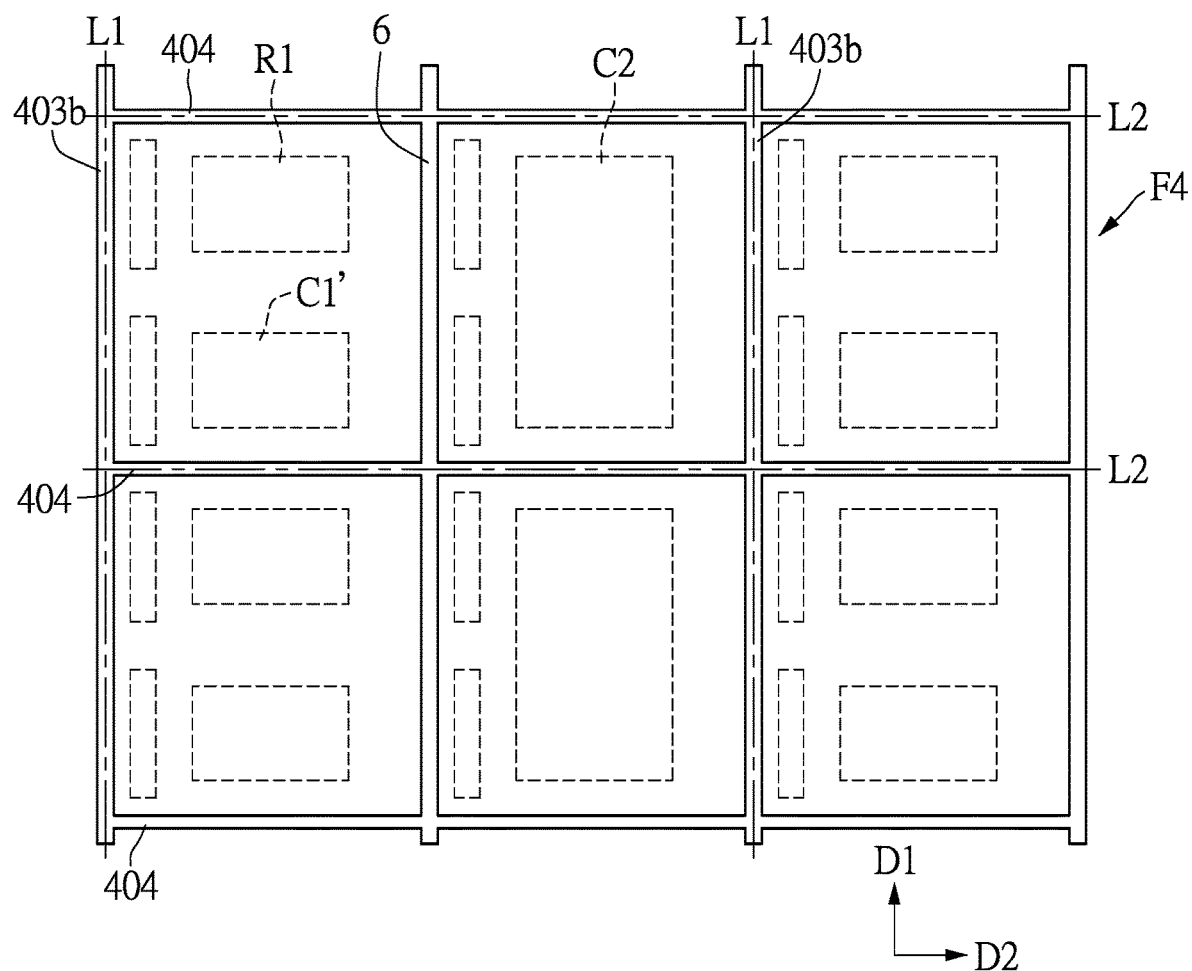
FIG. 17B shows a bottom view of the chip package structure in a step S222 of the manufacturing method in FIG. 8 in accordance with another embodiment of the instant disclosure.
Figure 18:
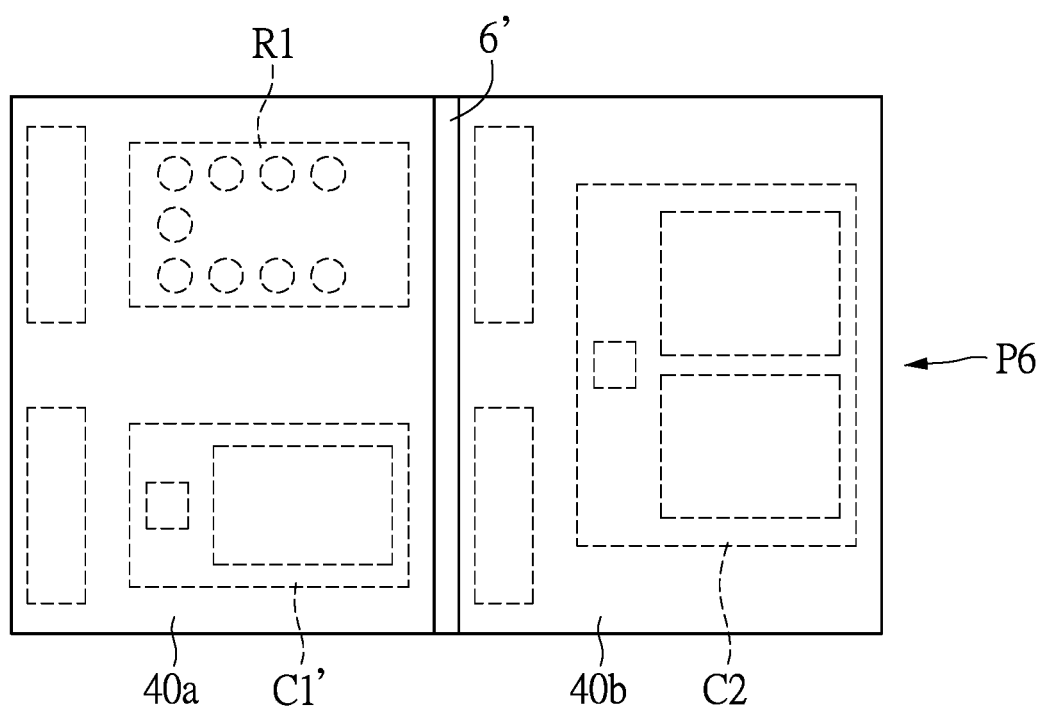
FIG. 18 shows a bottom view of a chip package structure in accordance with another embodiment of the instant disclosure.

Thereafter, as shown in FIG. 17B, in step S222, the conductive frame F1 is cut along the first cutting lines L1 in the first direction D1 according to the positions of the first cutting grooves 403b and along the second cutting lines L2 in the second direction D2 according to the positions of the second cutting grooves 404 to form a plurality of separated chip package structures P6.

Please refer to FIG. 18. The chip package structure P6 includes lead frame, the control chip R1, the first chip C1' and the second chip C2.

The lead frame includes a bottom portion and at least one partition plate (four partition plates are shown in FIG. 18), in which the bottom portion includes a first conductive portion 40a and a second conductive portion 40b. The first and second conductive portion 40a, 40b are separated from each other. The control chip R1 and the first chip C1' are disposed on the first conductive portion 40a, and the control chip R1 is insulated from the first conductive portion 40a. The second chip C2 is disposed on the second conductive portion 40b.

The control chip R1 can be electrically connected to the control terminations of the first and second chips C1', C2 through the lead frame and the traces configured on the printed circuit board. In the instant embodiment, the control chip R1 and the first chip C1 are vertically and immediately adjacent to each other, but arranged in two different accommodating regions. Furthermore, the second chip C2' correspondingly occupies two accommodating regions.

In addition, the chip package structure P6 further includes an insulating bonding layer 6' connecting between the first and second conductive portions 40a, 40b so as to insulate the first conductive portion 40a from the second conductive portion 40b. When the chip package structure P6 is assembled on the printed circuit board, the source of the first chip C1' can be electrically connected to the drain of the second chip C2 through the printed circuit board, the partition plate and the second conductive portion 40b.

In summary, the manufacturing methods of a chip package structure are provided in the abovementioned embodiments. In the manufacturing methods, the separated chips are arranged in the conductive frame. The conductive frame can replace the molding compound to provide structural support and mechanical strength for the chip to reduce the use of the molding compound. Furthermore, in the chip package structures provided in the instant disclosure, the drain of the chip is electrically connected to the lead frame, and the source and the gate of the chip formed on the active surface can be electrically connected to the printed circuit board. Additionally, the chip is interposed between the lead frame and the printed circuit board, thereby, creating bidirectional heat dissipation from the chip during the operation of the chip.

Furthermore, by changing the cutting positions and the insulating pattern during the cutting process of the conductive frame, different types of chip package structures can be formed to be implemented in different kinds of circuits. The chip package structures provided by the embodiments of the instant disclosure have the pads directly formed on the electrodes (such as the gate or source), so that the package structure can be directly connected to the printed circuit board through the pads, which can reduce the parasitic resistance and parasitic inductance. The operating efficiency of the electronic device can be improved by using the package structure of the instant disclosure.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A manufacturing method of a chip package structure comprising:
    providing a conductive frame including a conductive bottom plate and a plurality of conductive partition plates, wherein the conductive bottom plate has a supporting surface and a bottom surface opposite to the supporting surface, and the conductive partition plates protrudes from the supporting surface to define a plurality of accommodating regions;
    fixing a plurality of individual chips in the accommodating regions respectively with a back surface of each chip connecting the supporting surface, wherein an air gap exists between each of the chips and the adjacent one of the conductive partition plates; and
    performing a cutting process on the conductive frame to form a plurality of separated chip package structures, wherein one of the chip package structures is a first chip package structure, and the first chip package structure comprises:
        a first lead frame having a bottom portion and a first conductive partition plate, wherein the bottom portion includes a first conductive portion and a second conductive portion, and the first conductive partition plate protrudes from the second conductive portion;
        an insulating bonding layer formed between the first conductive portion and the second conductive portion;
        a first chip disposed on and electrically connected to the first conductive portion; and
        a second chip disposed on and electrically connected to the second conductive portion.

2. The manufacturing method of the chip package structure according to claim 1, before the step of fixing the chips in the accommodating regions further comprising:
    providing a wafer having a plurality of semiconductor devices;
    forming a wiring layer on each of the semiconductor devices; and
    dividing the wafer into a plurality of separated chips.

3. The manufacturing method of the chip package structure according to claim 1, wherein the conductive frame includes a plurality of cutting marks, first cutting grooves and second cutting grooves formed on the bottom surface, the first cutting grooves intersect with the second cutting grooves to define boundaries of each of the chip package structures.

4. The manufacturing method of the chip package structure according to claim 3, wherein the step of performing the cutting process on the conductive frame further comprises:
    cutting through the conductive frame according to the cutting marks to form an opening pattern on the bottom surface;
    injecting an insulating adhesive into the opening pattern to bond the conductive frame; and
    cutting the conductive frame according to the first cutting grooves and the second cutting grooves to form the chip package structures.

5. The manufacturing method of the chip package structure according to claim 4, wherein the opening pattern includes a plurality of first trenches, and the first trenches and the first cutting grooves are parallel to each other and arranged alternately.

6. The manufacturing method of the chip package structure according to claim 5, wherein the opening pattern includes a plurality of second trenches, and the second trenches and the second cutting grooves are parallel to each other and arranged alternately.

7. The manufacturing method of the chip package structure according to claim 1, wherein the first chip package structure further comprises a control chip fixed on and insulated from the first conductive portion by an insulation paste.

8. The manufacturing method of the chip package structure according to claim 1, wherein each of the chips has a gate pad and a source pad disposed on an active surface thereof, and the gate pad and the source pad are exposed at one side of each of the chip package structures.

9. A manufacturing method of a chip package structure comprising:
    providing a conductive frame including a conductive bottom plate and a plurality of conductive partition plates, wherein the conductive bottom plate has a supporting surface and a bottom surface opposite to the supporting surface, and the conductive partition plates are disposed on the supporting surface to define a plurality of accommodating regions;
    fixing a plurality of chips in the accommodating regions respectively with a back surface of each chip connecting the supporting surface; and
    performing a cutting process on the conductive frame to form a plurality of separated chip package structures, wherein one of the chip package structures is a first chip package structure, and the first chip package structure comprises:
        a first lead frame having a bottom portion and a first conductive partition plate, wherein the bottom portion includes a first conductive portion and a second conductive portion, and the first conductive partition plate protrudes from the second conductive portion;
        an insulating bonding layer formed between the first conductive portion and the second conductive portion;
        a first chip disposed on and electrically connected to the first conductive portion; and
        a second chip disposed on and electrically connected to the second conductive portion;
        wherein, each of the first and second chips has a gate pad and a source pad disposed on an active surface thereof, and the gad pad and the source pad located at the active surface of each of the first and second chips are exposed at one side of the first chip package structures.

* * * * *